United States Patent
Tsukamoto

(10) Patent No.: US 10,998,497 B2
(45) Date of Patent: May 4, 2021

(54) SEMICONDUCTOR MEMORY DEVICE

(71) Applicant: KIOXIA CORPORATION, Tokyo (JP)

(72) Inventor: Takayuki Tsukamoto, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/807,797

(22) Filed: Mar. 3, 2020

(65) Prior Publication Data

US 2021/0074915 A1    Mar. 11, 2021

(30) Foreign Application Priority Data

Sep. 5, 2019    (JP) .............................. JP2019-161925

(51) Int. Cl.
*G11C 13/00* (2006.01)
*H01L 45/00* (2006.01)
*H01L 27/24* (2006.01)

(52) U.S. Cl.
CPC .......... *H01L 45/122* (2013.01); *G11C 13/004* (2013.01); *G11C 13/0026* (2013.01); *G11C 13/0028* (2013.01); *G11C 13/0069* (2013.01); *H01L 27/2463* (2013.01); *G11C 2013/0045* (2013.01); *G11C 2013/0078* (2013.01)

(58) Field of Classification Search
None
See application file for complete search history.

(56) References Cited

U.S. PATENT DOCUMENTS

| 8,331,137 | B2 | 12/2012 | Takashima | |
|---|---|---|---|---|
| 8,987,696 | B2 | 3/2015 | Sonehara | |
| 2009/0296458 | A1* | 12/2009 | Lee | G11C 13/0004 365/163 |
| 2013/0242642 | A1* | 9/2013 | Katayama | G11C 13/00 365/148 |
| 2013/0329485 | A1* | 12/2013 | Takashima | G11C 13/0011 365/148 |
| 2014/0301129 | A1* | 10/2014 | Kawai | G11C 13/0069 365/148 |
| 2014/0355326 | A1 | 12/2014 | Okawa | |
| 2016/0149129 | A1 | 5/2016 | Bodke | |

(Continued)

FOREIGN PATENT DOCUMENTS

JP    2011-018838 A    1/2011
JP    2014-235773 A    12/2014

*Primary Examiner* — Tan T. Nguyen
(74) *Attorney, Agent, or Firm* — Foley & Lardner LLP

(57) ABSTRACT

A semiconductor memory device includes a control circuit, first wirings, second wirings intersecting the first wirings, and memory cells formed between the first wirings and the second wirings. The control circuit is configured to supply, in a set operation, a set pulse between one of the first wirings and one of the second wirings, supply, in a reset operation, a reset pulse between one of the first wirings and one of the second wirings, and supply, in a first operation, a first pulse between one of the first wirings and one of the second wirings. The first pulse has an amplitude larger than a larger one of an amplitude of the set pulse or an amplitude of the reset pulse, or the same amplitude as the larger amplitude. The first pulse has a pulse width larger than a pulse width of the reset pulse.

11 Claims, 18 Drawing Sheets

(56) References Cited

U.S. PATENT DOCUMENTS

2016/0155502 A1* 6/2016 Goux ................ H01L 45/1233
365/148
2017/0358350 A1 12/2017 Kim et al.

* cited by examiner ately larger
SEMICONDUCTOR MEMORY DEVICE

CROSS-REFERENCE TO RELATED APPLICATION(S)

This application claims the benefit of and priority to Japanese Patent Application No. 2019-161925, filed on Sep. 5, 2019, the entire contents of which are incorporated herein by reference.

FIELD

Embodiments described herein relate generally to a semiconductor memory device.

BACKGROUND

There is known a semiconductor memory device including a plurality of first wirings, a plurality of second wirings intersecting the plurality of first wirings, and a plurality of memory cells formed between the plurality of first wirings and the plurality of second wirings, each of the memory cells including a variable resistance layer and a nonlinear element layer including chalcogen.

DESCRIPTION OF THE DRAWINGS

FIG. 11 is a schematic graph illustrating voltages of a selected bit line BL and a selected word line WL in a read operation, a write operation and the like.

DETAILED DESCRIPTION

Figure 1:
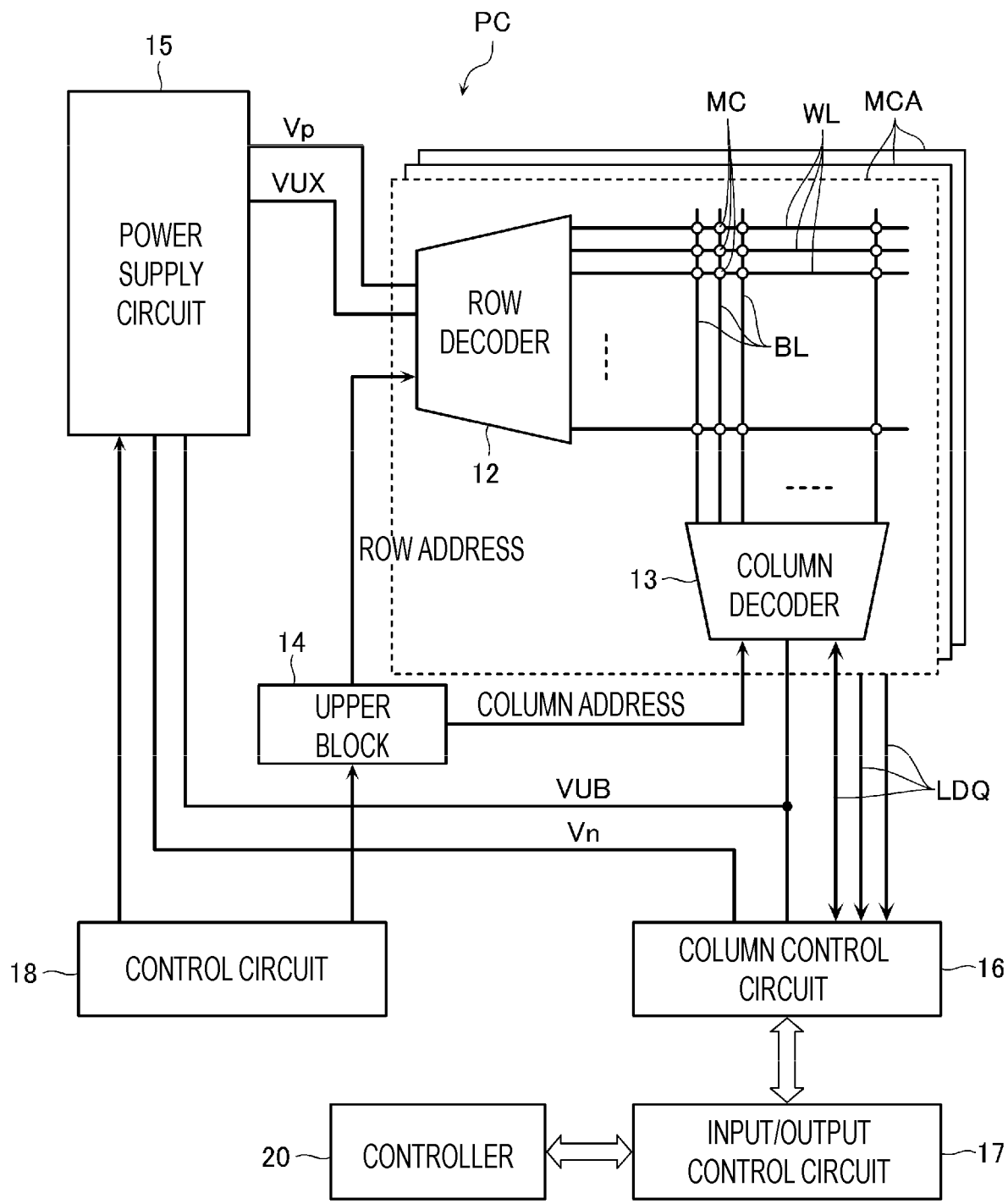
FIG. 1 is a schematic functional block diagram illustrating a partial configuration of a semiconductor memory device according to a first embodiment.

Embodiments provide a semiconductor memory device of long life.

In general, according to one embodiment, a semiconductor memory device may include a plurality of first wirings, a plurality of second wirings intersecting the plurality of first wirings, and a plurality of memory cells formed between the plurality of first wirings and the plurality of second wirings. Each of the memory cells may include a variable resistance layer and a nonlinear element layer including chalcogen. In a set operation, a set pulse may be supplied between one of the plurality of first wirings and one of the plurality of second wirings. In a reset operation, a reset pulse may be supplied between one of the plurality of first wirings and one of the plurality of second wirings. In a first operation, a first pulse may be supplied between one of the plurality of first wirings and one of the plurality of second wirings. The first pulse may have an amplitude larger than relatively larger one of the amplitude of the set pulse and the amplitude of the reset pulse, or the same amplitude as the relatively larger amplitude and a pulse width larger than the pulse width of the reset pulse.

According to another embodiment, a semiconductor memory device may include a plurality of first wirings, a plurality of second wirings intersecting the plurality of first wirings, a plurality of memory cells formed between the plurality of first wirings and the plurality of second wirings, and a sense amplifier circuit connected to the plurality of first wirings. Each of the memory cells may include a variable resistance layer and a nonlinear element layer including chalcogen. The semiconductor memory device may execute a first sequence including a first operation, a read operation of n (n being a natural number of more than or equal to 2) times executed after the first operation, a first operation of n times executed after the n-time read operation, and a write operation of n times executed after the n-time first operation. In the first operation, a first pulse may be supplied between at least one of the plurality of first wirings and at least two of the plurality of second wirings, and a detection by the sense amplifier circuit may be executed. In the read operation, a read pulse may be supplied between one of the plurality of first wirings and one of the plurality of second wirings, and a detection by the sense amplifier circuit may be executed. In the n-time first operation, a reset pulse may be supplied between one of the plurality of first wirings and one of the plurality of second wirings. In the n-time write operation, a write pulse may be supplied between one of the plurality of first wirings and one of the plurality of second wirings.

Next, a semiconductor memory device according to embodiments will be described in detail with reference to the accompanying drawings. In addition, the following embodiments are merely examples, and are not intended to limit the present disclosure.

In the descriptions herein, a predetermined direction parallel to the surface of a substrate is referred to as an X direction, a direction parallel to the surface of the substrate and perpendicular to the X direction is referred to as a Y direction, and a direction perpendicular to the surface of the substrate is referred to as a Z direction.

In addition, in the description herein, a direction along a predetermined plane may be referred to as a first direction, a direction intersecting the first direction along the predetermined plane may be referred to as a second direction, and a direction intersecting the predetermined plane may be referred to as a third direction. The first direction, second direction, and third direction may or may not correspond to any of the X direction, the Y direction, and the Z direction.

In the present disclosure, expressions such as "upper" and "lower" are defined based on a substrate. For example, when the first direction intersects the surface of the substrate, the direction away from the substrate along the first direction is referred to as an upper direction, and the direction approaching the substrate along the first direction is referred to as a lower direction. In addition, a lower surface or a lower end of a certain component indicates the surface or end of the component close to the substrate, and an upper surface or an upper end of a certain component indicates the surface or end of the component opposite to the substrate. Further, a surface intersecting the second direction or the third direction is referred to as a side surface.

Further, in the descriptions herein, the "semiconductor memory device" may mean, for example, a memory chip or a memory die, a configuration including a controller chip or a controller die in addition to the memory chip or the memory die, or a device or the like on which this configuration are mounted.

Hereinafter, the circuit configuration of a semiconductor memory device according to embodiments will be described with reference to the drawings. In addition, the following drawings are schematic, and may omit some components for the convenience of explanation.

First Embodiment

[Circuit Configuration]

Figure 2:
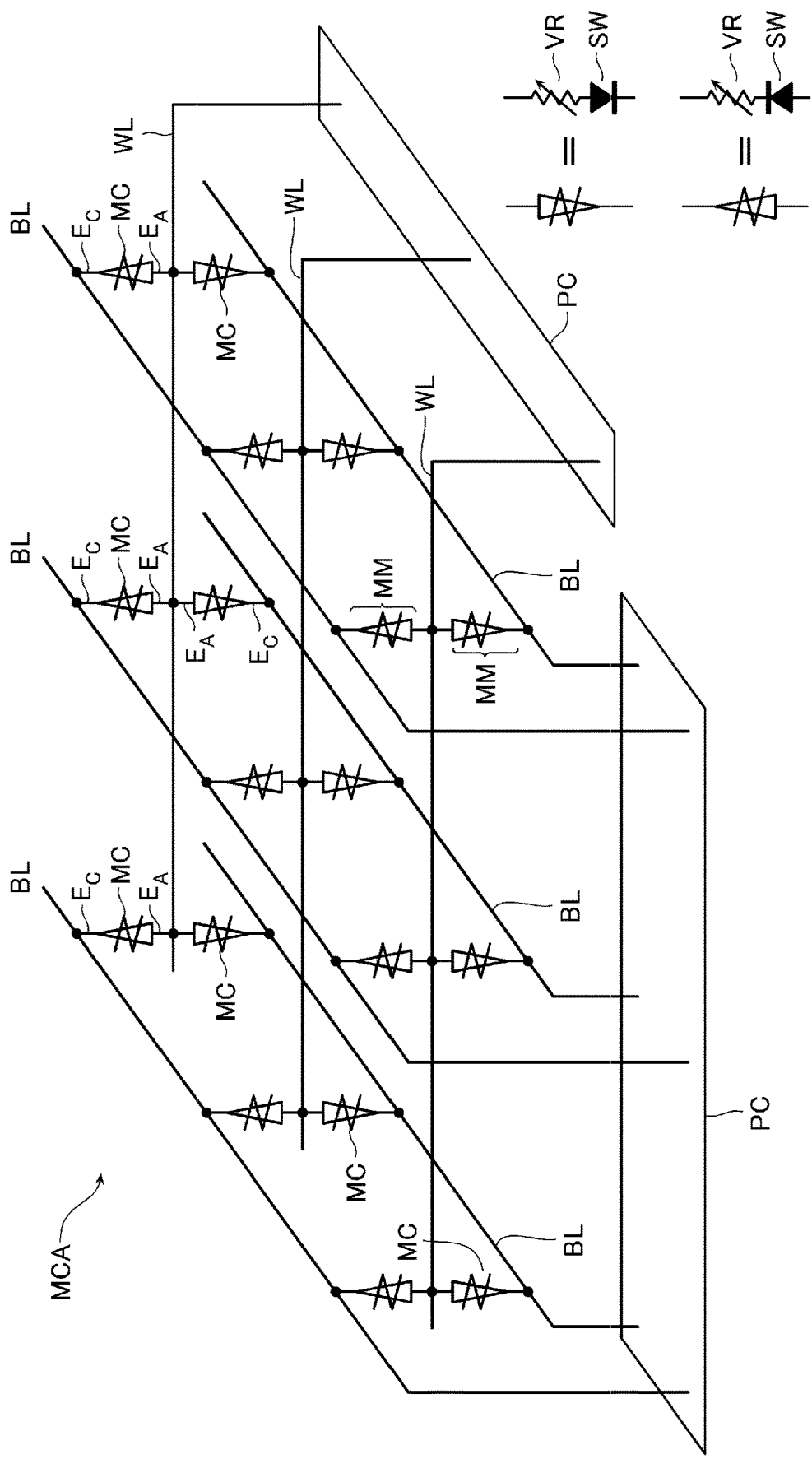
FIG. 2 is a schematic circuit diagram illustrating a partial configuration of the semiconductor memory device.
Figure 3:
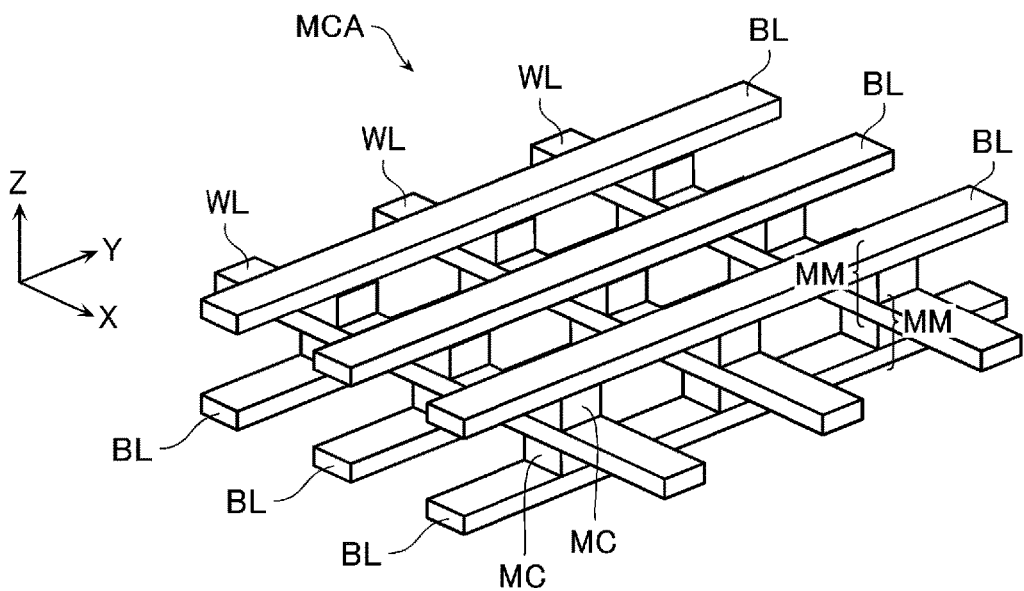
FIG. 3 is a schematic perspective view illustrating a partial configuration of the semiconductor memory device.

First, a circuit configuration of a semiconductor memory device according to a first embodiment will be described with reference to FIGS. 1 to 3. FIG. 1 is a schematic block diagram illustrating a configuration of a portion of the semiconductor memory device. FIG. 2 is a schematic circuit diagram illustrating a configuration of a portion of the semiconductor device. FIG. 3 is a schematic perspective view illustrating a configuration of a portion of the semiconductor memory device.

As illustrated in FIG. 1, the semiconductor memory device according to the present embodiment includes a plurality of memory cell arrays MCA, a peripheral circuit PC that controls the memory cell arrays MCA, and a controller 20 that controls the memory cell arrays MCA through the peripheral circuit PC.

As illustrated in FIG. 3, each memory cell array MCA includes, for example, a plurality of memory mats MM arranged in the Z direction. Each memory mat MM includes a plurality of bit lines BL arranged in the X direction and extending in the Y direction, a plurality of word lines WL arranged in the Y direction and extending in the X direction, and a plurality of memory cells MC arranged in the X direction and the Y direction corresponding to the bit lines BL and the word lines WL. In the example illustrated in FIG. 3, two memory mats MM arranged in the Z direction share a word line WL.

In the example of FIG. 2, a cathode $E_C$ of a memory cell MC is connected to a bit line BL, and an anode $E_A$ of a memory cell MC is connected to a word line WL. Each memory cell MC includes a variable resistance element VR and a nonlinear element NO (see FIG. 9A).

As illustrated in FIG. 1, the peripheral circuit PC includes, for example, a plurality of row decoders 12 (voltage transfer circuits) and a plurality of column decoders (voltage transfer circuits) formed corresponding to the plurality of memory cell arrays MCA. Further, the peripheral circuit PC includes an upper block decoder 14 that supplies a row address and a column address to each row decoder 12 and each column decoder 13, respectively, a power supply circuit (voltage output circuit) 15 that outputs voltages to be supplied to each bit line BL and each word line WL, a column control circuit 16 connected to the column decoder 13, an input/output control circuit 17 connected to the column control circuit 16, and a control circuit 18 that controls the upper block decoder 14, the power supply circuit 15, the column control circuit 16, and the input/output control circuit 17.

The row decoder 12 may include, for example, a plurality of transfer transistors connected between the plurality of word lines WL and a plurality of voltage supply lines Vp and VUX. The row decoder 12 may make a selected word line WL corresponding to the supplied row address conductive with the voltage supply line Vp, and make other unselected word lines WL conductive with the voltage supply line VUX.

The column decoder 13 may include, for example, a plurality of transfer transistors connected between the plurality of bit lines BL and the plurality of voltage supply lines Vn and VUB. The column decoder 13 may make a selected bit line BL corresponding to the supplied column address conductive with a wiring LDQ, and make other unselected bit lines BL conductive with the voltage supply line VUB.

The power supply circuit 15 may include, for example, a plurality of step-down circuits such as regulators, corresponding to the plurality of voltage supply lines Vp, VUX, Vn, and VUB. The power supply circuit 15 may adjust voltages of the plurality of voltage supply lines Vp, VUX, Vn, and VUB by appropriately stepping down a power supply voltage in accordance with a control signal from the control circuit 18.

The column control circuit 16 may include, for example, a sense amplifier circuit and a voltage transfer circuit connected to the wiring LDQ, and a data buffer circuit. The sense amplifier circuit may detect a magnitude relationship between a voltage or current of the wiring LDQ and a predetermined threshold voltage according to a control signal from the control circuit 18, and output the magnitude relationship as data of "0" or "1" to the data buffer circuit. According to the control signal from the control circuit 18, the voltage transfer circuit may make the wiring LDQ corresponding to the bit of "0" in the data buffer circuit conductive with the voltage supply line Vn, and make the wiring LDQ corresponding to the bit of "1" conductive with the voltage supply line VUB. In addition, the relationship between the bit of "0" and the bit of "1" may be reversed.

The input/output control circuit 17 may output data received from the data buffer circuit in the column control circuit 16 to the controller 20. Further, the input/output control circuit 17 may output data received from the controller 20 to the data buffer circuit in the column control circuit 16.

The controller 20 may include, for example, a processor, a RAM, a ROM, an ECC circuit, etc., and perform processes such as conversion between a logical address and a physical address, bit error detection/correction, wear leveling and the like. [Example of Configuration]

Next, an example of the configuration of the semiconductor memory device according to the present embodiment will be described in more detail with reference to FIGS. 4 to 9.

Figure 4:
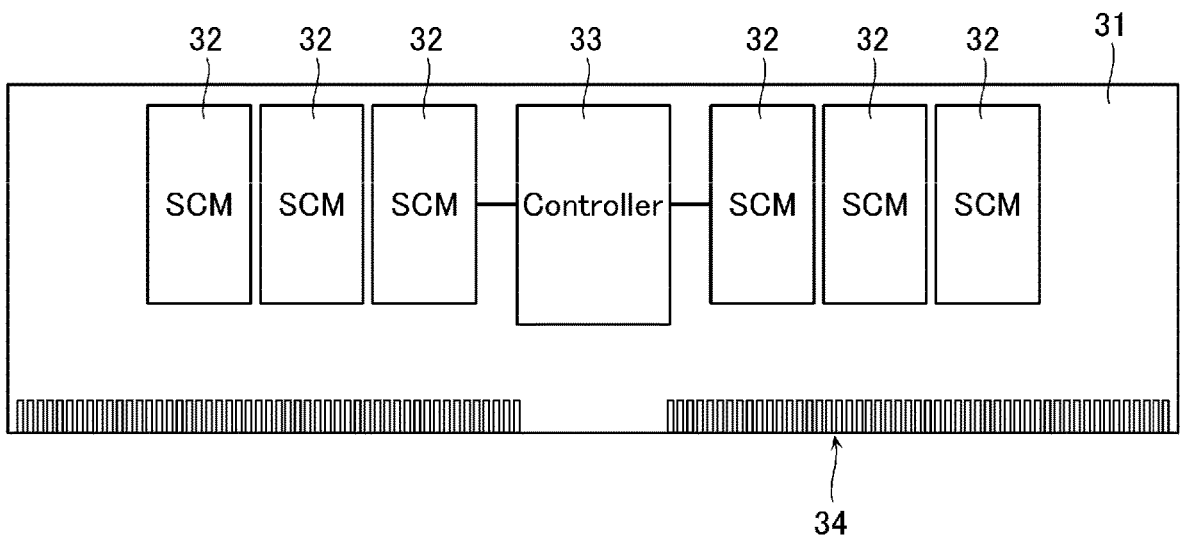
FIG. 4 is a schematic perspective view illustrating a partial configuration of the semiconductor memory device.

FIG. 4 is a schematic plan view illustrating an example of a configuration of a memory system according to the present embodiment. The memory system according to the present embodiment includes a mounting substrate 31, a plurality of memory chips 32 mounted on the mounting substrate 31, and a controller chip 33 mounted on the mounting substrate 31. Each of the plurality of memory chips 32 includes the plurality of memory cell arrays MCA and the peripheral circuit PC described with reference to FIG. 1 and so on. Each of the plurality of memory chips 32 is connected to the controller chip 33 via a printed wiring or the like formed on the mounting substrate 31. The controller chip 33 corresponds to the controller 20 described with reference to FIG. 1. The controller chip 33 may be connected to a host computer or the like via a printed wiring formed on the mounting substrate 31, a terminal 34 formed at the end of the mounting substrate 31, and the like.

Figure 5:
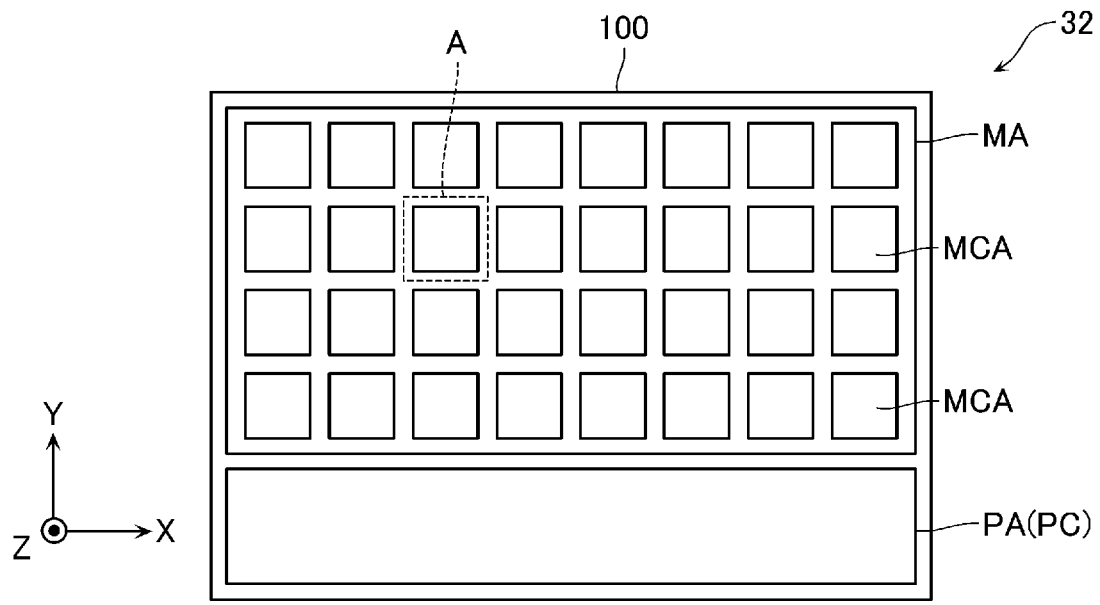
FIG. 5 is a schematic plan view illustrating a partial configuration of the semiconductor memory device.

FIG. 5 is a schematic plan view illustrating an example of the configuration of the memory chip 32. The memory chip 32 includes a substrate 100. A memory area MA and a peripheral area PA are formed in the substrate 100. A plurality of memory cell arrays MCA arranged in the form of a matrix in the X direction and the Y direction are formed in the memory area MA. A portion of the peripheral circuit PC is formed in the peripheral area PA.

Figure 6:
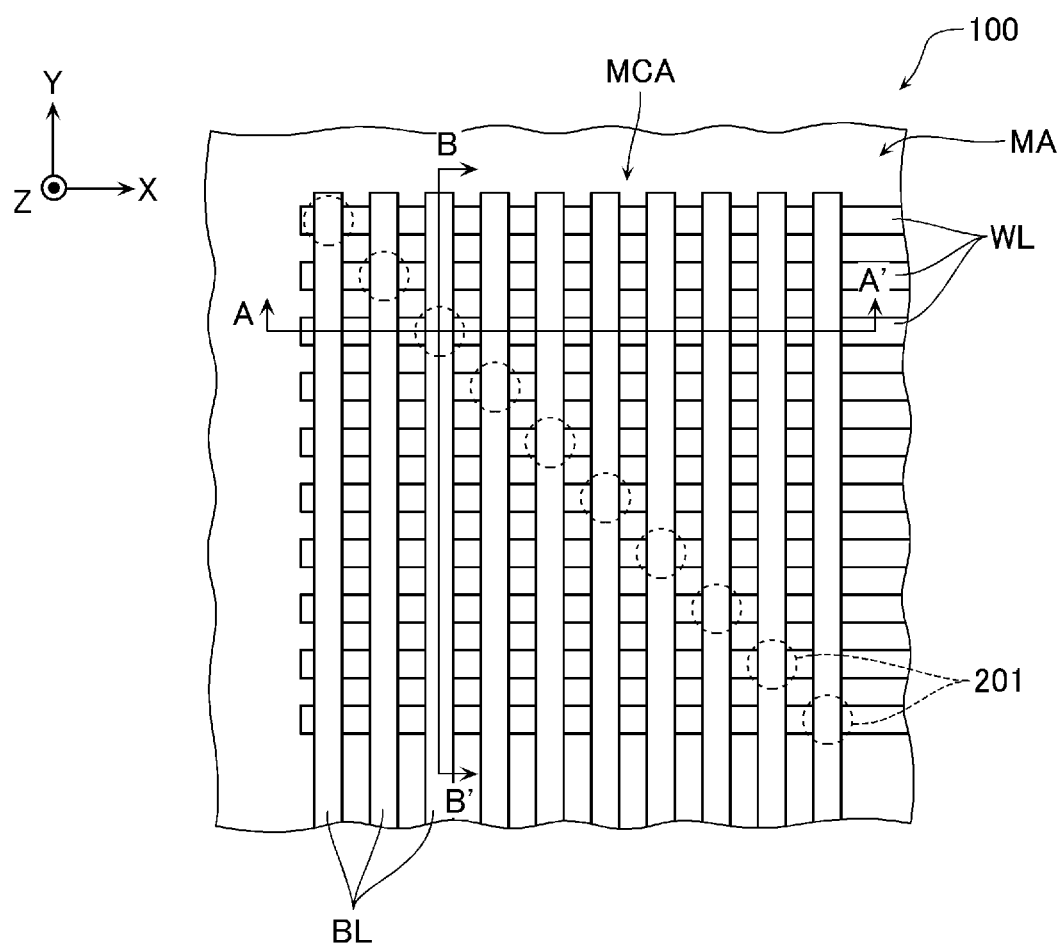
FIG. 6 is a schematic enlarged view of a portion indicated by A in FIG. 5.
Figure 7:
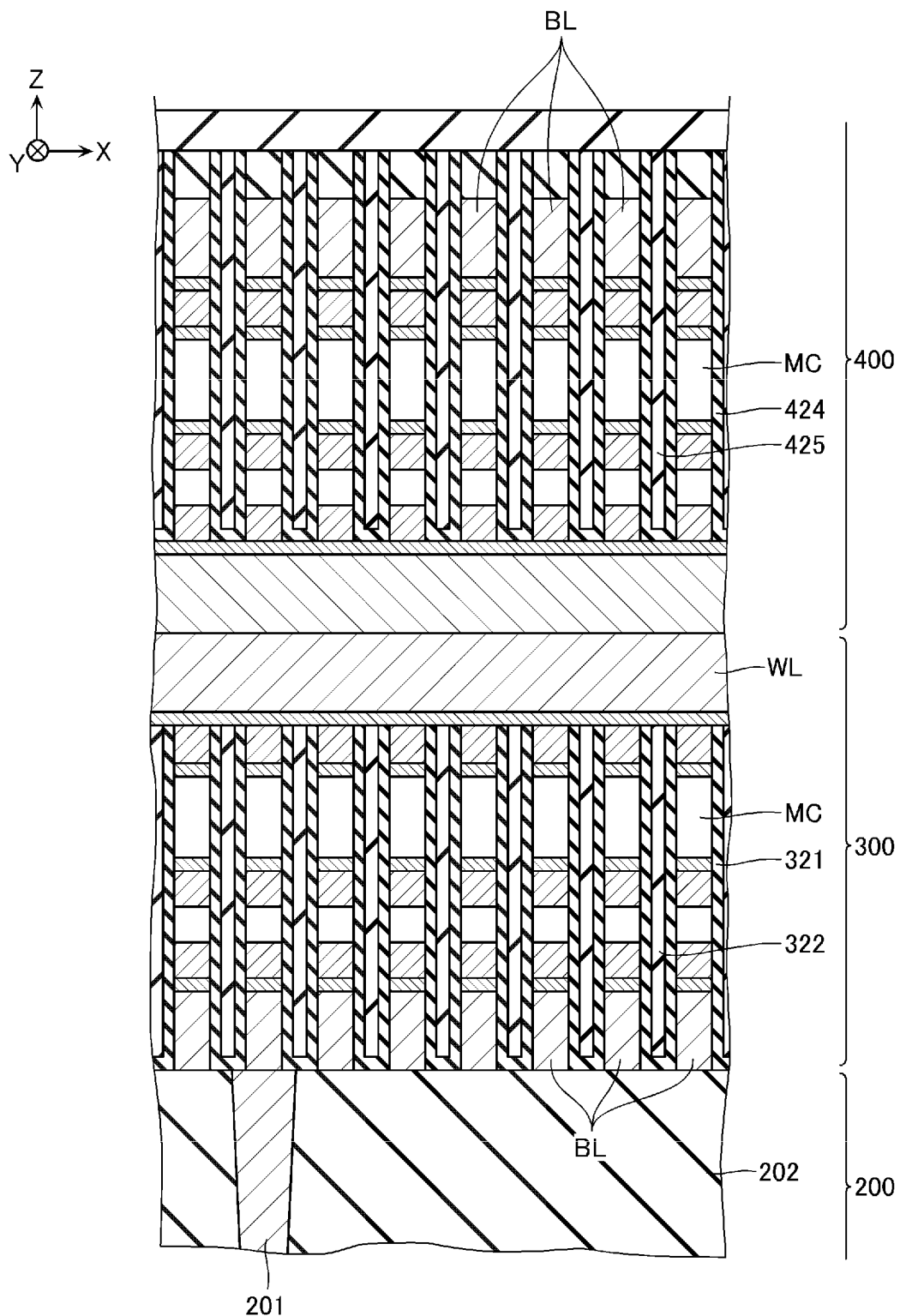
FIG. 7 is a schematic cross-sectional view of the structure illustrated in FIG. 6, which is taken along line A-A' and viewed in the direction of an arrow.
Figure 8:
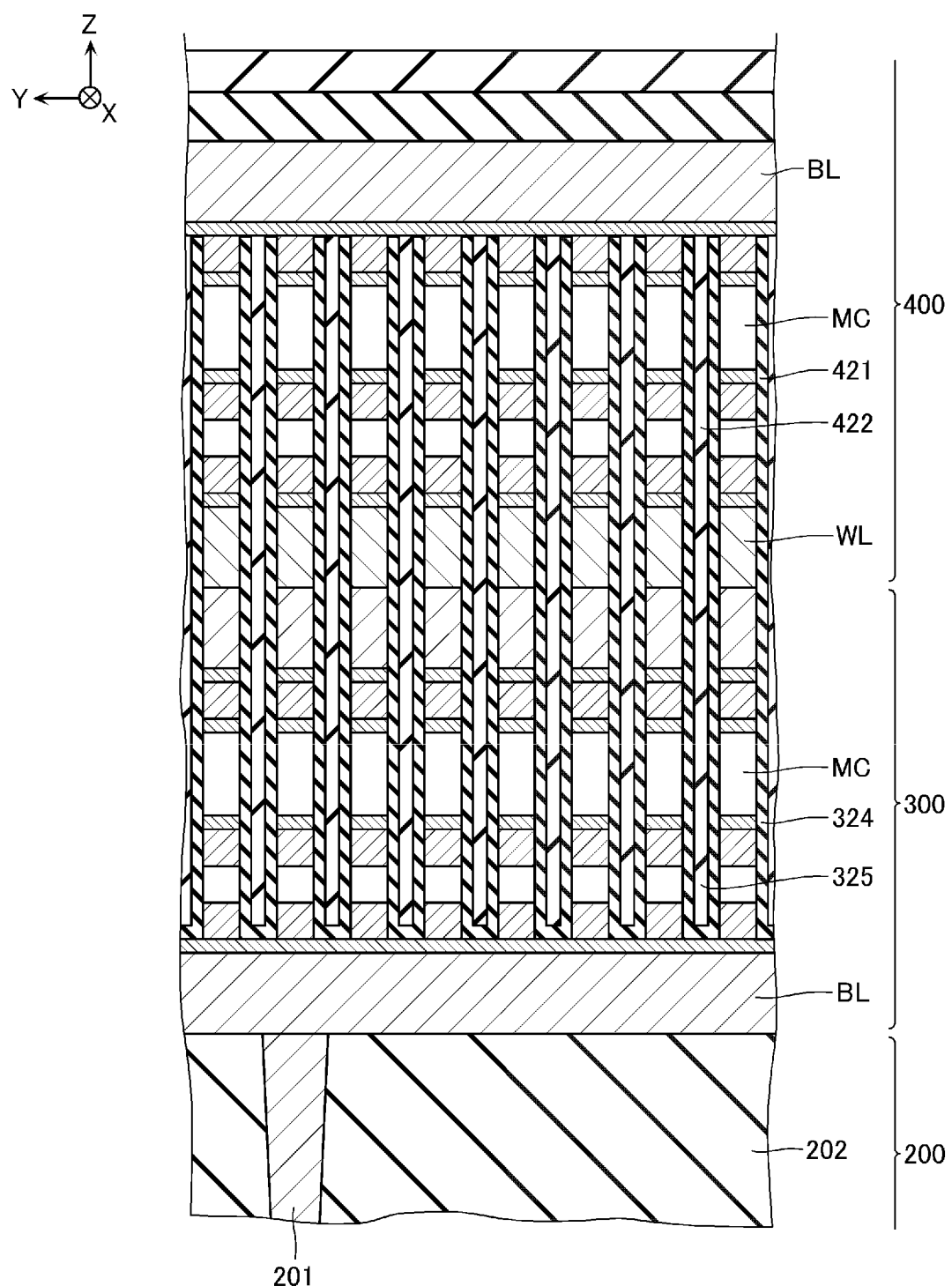
FIG. 8 is a schematic cross-sectional view of the structure illustrated in FIG. 7, which is taken along line B-B' and viewed in the direction of an arrow.
Figure 9A:
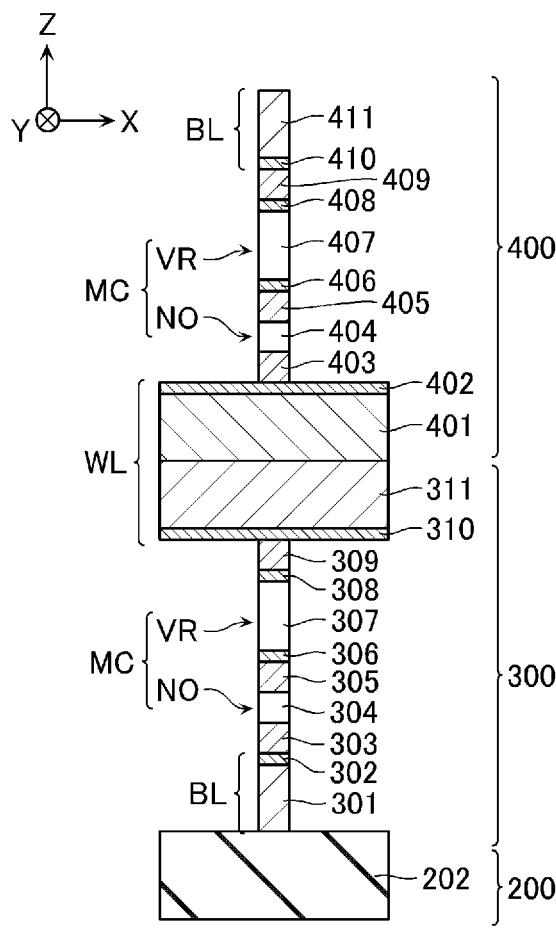
FIGS. 9A and 9B are schematic cross-sectional views corresponding to portions of FIGS. 7 and 8.
Figure 9B:
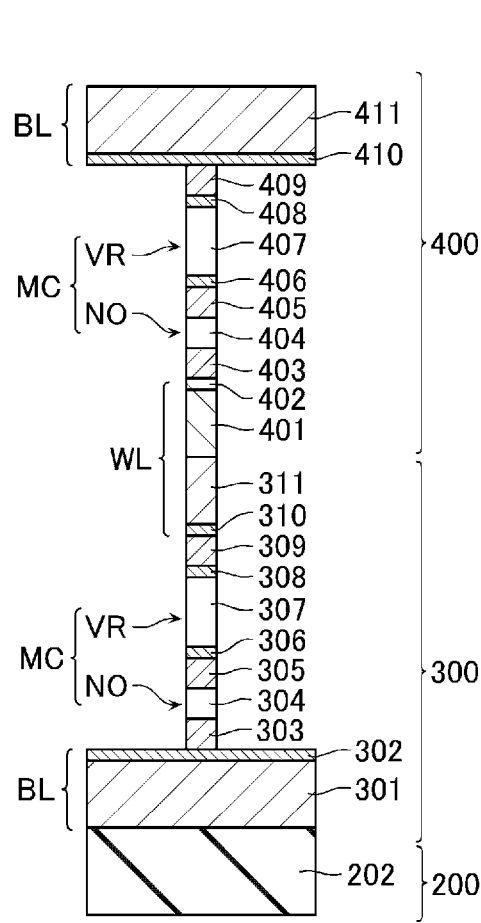

FIG. 6 is a schematic enlarged view of a portion indicated by A in FIG. 5. FIG. 7 is a schematic sectional view of the structure illustrated in FIG. 6, which is taken along line A-A' and viewed in the direction of an arrow. FIG. 8 is a schematic sectional view of the structure illustrated in FIG. 6, which is taken along line B-B' and viewed in the direction of an arrow. FIGS. 9A and 9B are schematic sectional views corresponding to portions of FIGS. 7 and 8.

As illustrated in FIG. 7, the semiconductor memory device according to the present embodiment includes a wiring layer 200, a memory layer 300 formed on the wiring layer 200, and a memory layer 400 formed on the memory layer 300.

The wiring layer 200 includes a contact wiring 201 (FIG. 7) and an insulating layer 202 (FIG. 7) formed between contact wirings 201.

The contact wiring 201 may extend in the Z direction and function as a contact connected to a bit line BL. The contact wiring 201 includes, for example, a stacked film of titanium nitride (TiN) and tungsten (W), or the like.

The insulating layer 202 may include, for example, silicon oxide ($SiO_2$) or the like.

As illustrated in FIGS. 9A and 9B, the memory layer 300 includes, for example, a conductive layer 301, a barrier conductive layer 302, an electrode layer 303, a chalcogen layer 304, an electrode layer 305, a barrier conductive layer 306, a chalcogen layer 307, a barrier conductive layer 308, an electrode layer 309, a barrier conductive layer 310, and a conductive layer 311.

The conductive layer 301 is formed on the upper surface of the insulating layer 202. The conductive layer 301 may extend in the Y direction and function as a portion of a bit line BL. The conductive layer 301 may include, for example, tungsten (W) or the like.

The barrier conductive layer 302 is formed on the upper surface of the conductive layer 301. The barrier conductive layer 302 may extend in the Y direction and function as a portion of a bit line BL. The barrier conductive layer 302 may include, for example, tungsten nitride (WN) or the like.

The electrode layer 303 is formed on the upper surface of the barrier conductive layer 302. The electrode layer 303 may function as the cathode $E_c$ of a memory cell MC. The electrode layer 303 may include, for example, carbon nitride (CN) or the like.

The chalcogen layer 304 is formed on the upper surface of the electrode layer 303. The chalcogen layer 304 may function as the nonlinear element NO. For example, when a voltage lower than a predetermined threshold voltage is applied to the chalcogen layer 304, the chalcogen layer 304 may be in a high resistance state. When the voltage applied to the chalcogen layer 304 reaches the predetermined threshold voltage, the chalcogen layer 304 may become a low resistance state, and a current flowing through the chalcogen layer 304 may increase by several orders of magnitude. When the voltage applied to the chalcogen layer 304 falls below a predetermined voltage for a certain time, the chalcogen layer 304 may become the high resistance state again.

The chalcogen layer 304 may include, for example, at least one kind of chalcogen. The chalcogen layer 304 may include, for example, chalcogenide, which is a compound containing chalcogen. In addition, the chalcogen layer 304 may include at least one type of element selected from a group consisting of B, Al, Ga, In, C, Si, Ge, Sn, As, P, or Sb.

In addition, the chalcogen referred-to here indicates an element, except for oxygen (O), among elements that belong to Group 16 of the periodic table. The chalcogen includes, for example, sulfur (S), selenium (Se), tellurium (Te) or the like.

The electrode layer 305 is formed on the upper surface of the chalcogen layer 304. The electrode layer 305 may function as an electrode connected to the variable resistance element VR and the nonlinear element NO. The electrode layer 305 may include, for example, carbon (C) or the like.

The barrier conductive layer 306 is formed on the upper surface of the electrode layer 305. The barrier conductive layer 306 may include, for example, tungsten nitride (WN) or the like.

The chalcogen layer 307 is formed on the upper surface of the barrier conductive layer 306. The chalcogen layer 307 may function as a variable resistance element VR. The chalcogen layer 307 may include, for example, a crystal region and a phase change region. The phase change region may be formed closer to the cathode side than the crystal region. The phase change region may become an amorphous state (reset state: high resistance state) by a heating to a melting temperature or higher and a rapid cooling. In addition, the phase change region may become a crystalline state (set state: low resistance state) by an overheating to a temperature lower than the melting temperature and higher than the crystallization temperature, and a slow cooling.

The chalcogen layer 307 may include, for example, at least one type of chalcogen. The chalcogen layer 307 may include, for example, chalcogenide, which is a compound containing chalcogen. The chalcogen layer 307 may be, for example, GeSbTe, GeTe, SbTe, SiTe or the like. In addition, the chalcogen layer 307 may include at least one type of element selected from a group consisting of germanium (Ge), antimony (Sb) and tellurium (Te).

The barrier conductive layer 308 is formed on the upper surface of the chalcogen layer 307. The barrier conductive layer 308 may include, for example, tungsten nitride (WN) or the like.

The electrode layer 309 is formed on the upper surface of the barrier conductive layer 308. The electrode layer 309 may function as the anode $E_A$ of a memory cell MC. The electrode layer 309 may include, for example, carbon (C) or the like.

The barrier conductive layer 310 is formed on the upper surface of the electrode layer 309. The barrier conductive layer 310 may extend in the X direction and function as a portion of a word line WL. The barrier conductive layer 310 may include, for example, tungsten nitride (WN) or the like.

The conductive layer 311 is formed on the upper surface of the barrier conductive layer 310. The conductive layer 311 may extend in the X direction and function as a portion of a word line WL. The conductive layer 311 may include, for example, tungsten (W) or the like.

In addition, for example, as illustrated in FIG. 7, barrier insulating layers 321 and insulating layers 322 each formed between the barrier insulating layers 321 are formed on the side surface of the memory layer 300 in the X direction. Each barrier insulating layer 321 may include silicon nitride (SiN) or the like. Each insulating layer 322 may include, for example, silicon oxide ($SiO_2$) or the like.

In addition, for example, as illustrated in FIG. 8, barrier insulating layers 324 and insulating layers 325 each formed between the barrier insulating layers 324 are formed on the side surface of the memory layer 300 in the Y direction. Each barrier insulating layer 324 may include silicon nitride (SiN) or the like. Each insulating layer 325 may include, for example, silicon oxide ($SiO_2$) or the like.

As illustrated in FIGS. 9A and 9B, the memory layer 400 includes a conductive layer 401, a barrier conductive layer 402, an electrode layer 403, a chalcogen layer 404, an electrode layer 405, a barrier conductive layer 406, a chalcogen layer 407, a barrier conductive layer 408, an electrode layer 409, a barrier conductive layer 410, and a conductive layer 411.

The conductive layer 401 is formed on the upper surface of the conductive layer 311. The conductive layer 401 may extend in the X direction and function as a portion of a word line WL. The conductive layer 401 may include, for example, tungsten (W) or the like.

The barrier conductive layer 402 is formed on the upper surface of the conductive layer 401. The barrier conductive layer 402 may extend in the X direction and function as a part of the word line WL. The barrier conductive layer 402 may include, for example, tungsten nitride (WN) or the like.

The electrode layer 403 is formed on the upper surface of the barrier conductive layer 402. The electrode layer 403 may function as the anode $E_A$ of a memory cell MC. The electrode layer 403 may include, for example, carbon nitride (CN) or the like.

The chalcogen layer 404 is formed on the upper surface of the electrode layer 403. The chalcogen layer 404 may function as the nonlinear element NO, like the chalcogen layer 304. The chalcogen layer 404 may include, for example, the same material as the chalcogen layer 304.

The electrode layer 405 is formed on the upper surface of the chalcogen layer 404. The electrode layer 405 may function as an electrode connected to the variable resistance element VR and the nonlinear element NO. The electrode layer 405 may include, for example, carbon (C) or the like.

The barrier conductive layer 406 is formed on the upper surface of the electrode layer 405. The barrier conductive layer 406 may include, for example, tungsten nitride (WN) or the like.

The chalcogen layer 407 is formed on the upper surface of the barrier conductive layer 406. Like the chalcogen layer 307, the chalcogen layer 407 may function as the variable resistance element VR. The chalcogen layer 407 may include, for example, the same material as the chalcogen layer 307.

The barrier conductive layer 408 is formed on the upper surface of the chalcogen layer 407. The barrier conductive layer 408 may include, for example, tungsten nitride (WN) or the like.

The electrode layer 409 is formed on the upper surface of the barrier conductive layer 408. The electrode layer 409 may function as the cathode $E_c$ of a memory cell MC. The electrode layer 409 may include, for example, carbon (C) or the like.

The barrier conductive layer 410 is formed on the upper surface of the electrode layer 409. The barrier conductive layer 410 may extend in the Y direction and function as a portion of a bit line BL. The barrier conductive layer 410 may include, for example, tungsten nitride (WN) or the like.

The conductive layer 411 is formed on the upper surface of the barrier conductive layer 410. The conductive layer 411 may extend in the Y direction and function as a portion of a bit line BL. The conductive layer 411 may include, for example, tungsten (W) or the like.

In addition, for example, as illustrated in FIG. 8, barrier insulating layers 421 and insulating layers 422 each formed between the barrier insulating layers 421 are formed on the side surface of the memory layer 400 in the Y direction. Each barrier insulating layer 421 may include silicon nitride (SiN) or the like. Each insulating layer 422 may include, for example, silicon oxide ($SiO_2$) or the like.

In addition, for example, as illustrated in FIG. 7, barrier insulating layers 424 and insulating layers 425 each formed between the barrier insulating layers 424 are formed on the side surface of the memory layer 400 in the X direction. Each barrier insulating layer 424 may include silicon nitride (SiN) or the like. Each insulating layer 425 may include, for example, silicon oxide ($SiO_2$).

Figure 10:
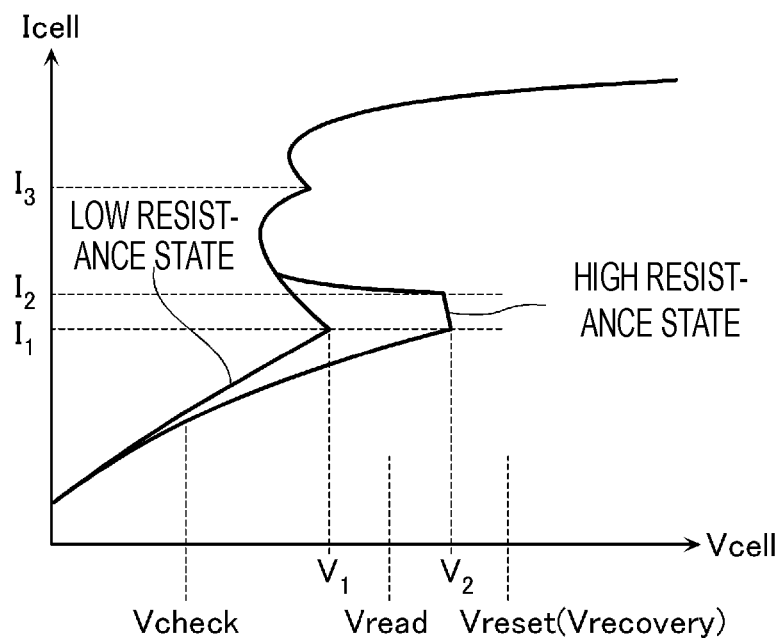
FIG. 10 is a schematic graph illustrating voltage-current characteristics of a memory cell MC of the semiconductor memory device.

FIG. 10 is a schematic graph illustrating current-voltage characteristics of the memory cell MC according to the present embodiment. The horizontal axis represents a cell voltage Vcell which is the voltage of the anode $E_A$ with respect to the cathode $E_c$ of the memory cell MC. The vertical axis represents a cell current Icell flowing through the memory cell MC on a logarithmic axis.

In a range where the cell current Icell is smaller than a predetermined current value $I_1$, the cell voltage Vcell monotonously increases as the cell current Icell increases. At the point of time when the cell current Icell reaches the current value $I_1$, the cell voltage Vcell of the memory cell MC in the low resistance state reaches a voltage $V_1$. In addition, the cell voltage Vcell of the memory cell MC in the high resistance state reaches a voltage $V_2$. The voltage $V_2$ is larger than the voltage $V_1$.

In a range where the cell current Icell is larger than the current value $I_1$ and smaller than a current value $I_2$, the cell voltage Vcell monotonously decreases as the cell current Icell increases. In this range, the cell voltage Vcell of the memory cell MC in the high resistance state is larger than the cell voltage Vcell of the memory cell MC in the low resistance state.

In a range where the cell current Icell is larger than the current value $I_2$ and smaller than a current value $I_3$, the cell voltage Vcell temporarily decreases and then increases as the cell current Icell increases. In this range, as the cell current Icell increases, the cell voltage Vcell of the memory cell MC in the high resistance state sharply decreases, and becomes substantially equal to the cell voltage Vcell of the memory cell MC in the low resistance state.

In a range where the cell current Icell is larger than the current value $I_3$, the cell voltage Vcell temporarily decreases and then increases as the cell current Icell increases.

In this state, when the cell current Icell is rapidly decreased to a value smaller than the current value $I_1$, the chalcogen layers 307 and 407 may become the high resistance state. In addition, when the cell current Icell is maintained at a current between the current value $I_2$ and the current value $I_3$ for a certain time or longer, and then, is decreased to a value smaller than the current value $I_1$, the chalcogen layers 307 and 407 may become the low resistance state.

[Operation]

Next, a read operation and a write operation of the semiconductor memory device according to the present embodiment will be described with reference to FIGS. 11 to 14. In addition, as the write operation, a set operation and a reset operation will be described.

Figure 11:
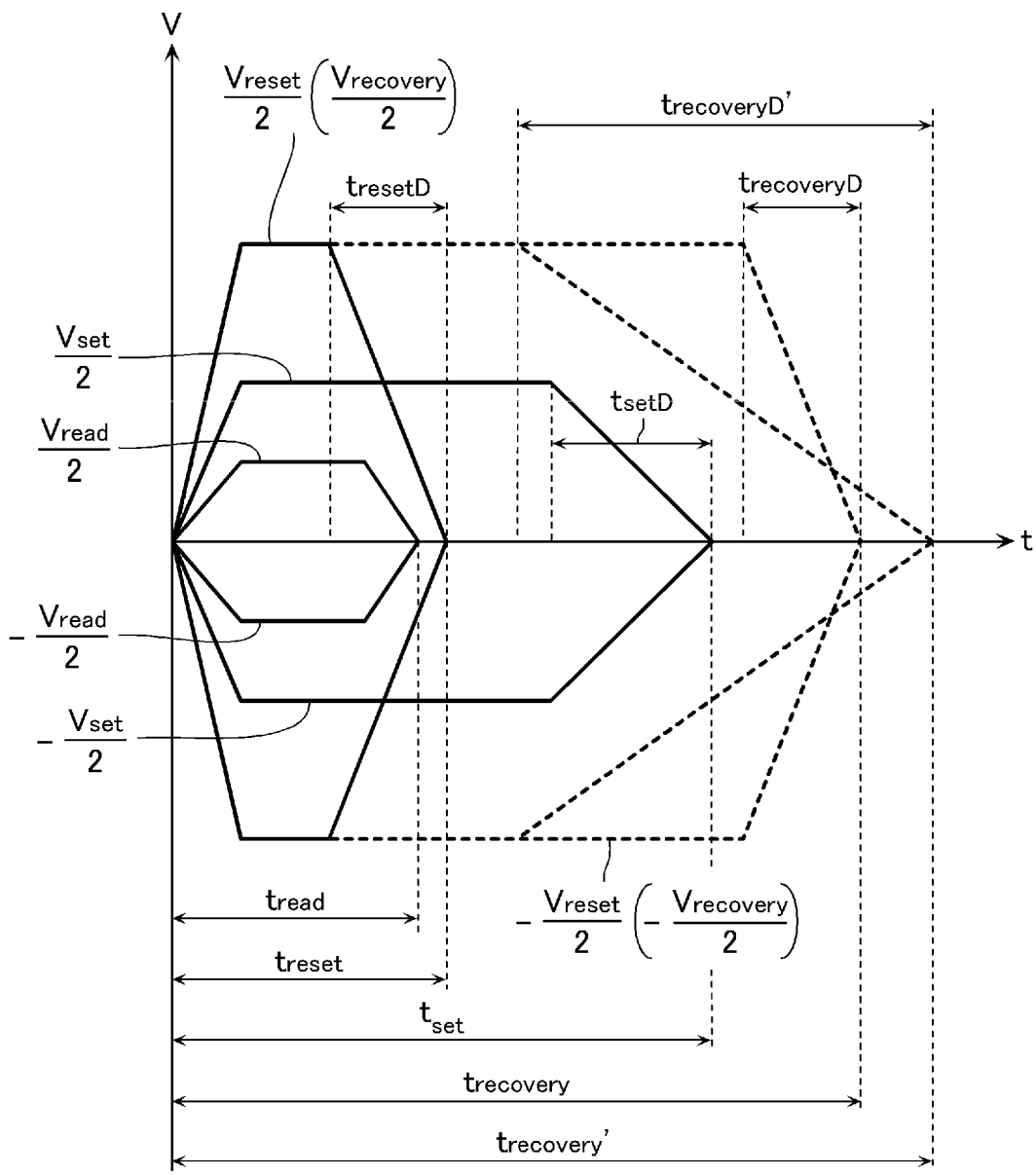

FIG. 11 is a schematic graph illustrating voltages of a selected bit line BL and a selected word line WL in a read operation, a write operation and the like. The vertical axis represents the voltage of the selected bit line BL and the selected word line WL, and the horizontal axis represents time.

[Read Operation]

Figure 12:
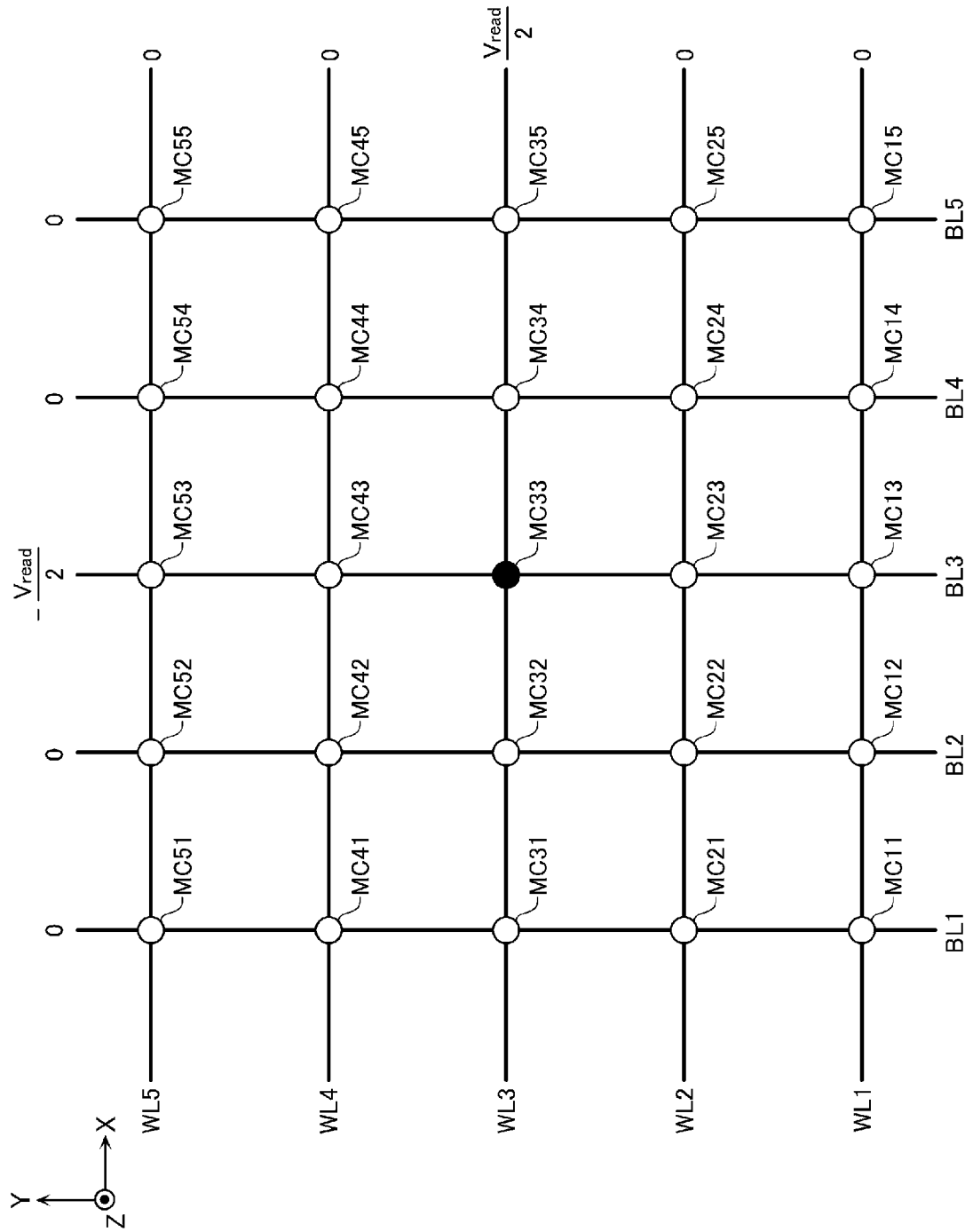
FIG. 12 is a schematic view illustrating voltages supplied to a bit line BL and a word line WL in a read operation.

FIG. 12 is a schematic view illustrating voltages supplied to bit lines BL and word lines WL in the read operation. In addition, in FIG. 12 and so on, bit lines BL1 to BL5 are illustrated as examples of a plurality of bit lines BL arranged in the X direction. Further, word lines WL1 to WL5 are illustrated as examples of a plurality of word lines WL arranged in the Y direction. Further, memory cells MC11 to MC55 are illustrated as examples of a plurality of memory cells MC connected to the bit lines BL1 to BL5 and the word lines WL1 to WL5. In the following description, a case where a memory cell MC33 is a selected memory cell MC will be exemplified.

In the read operation, for example, a plurality of memory mats MM arranged in the X direction are selected from the plurality of memory mats MM formed on the substrate 100 (see FIG. 5), and the following operation is executed in the plurality of selected memory mats MM. That is, a voltage $-V_{read}/2$ may be transferred to a selected bit line BL3. For example, the selected bit line BL3 may be brought into conduction with the voltage supply line Vn, and the voltage of the voltage supply line Vn may be set to the voltage $-V_{read}/2$. Further, a voltage 0V may be transferred to unselected bit lines BL1, BL2, BL4, and BL5. For example, the unselected bit lines BL1, BL2, BL4, and BL5 may be brought into conduction with the voltage supply line VUB, and the voltage of the voltage supply line VUB may be set to the voltage 0V. Further, a voltage $V_{read}/2$ may be transferred to a selected word line WL3. For example, the selected word line WL3 may be brought into conduction with the voltage supply line Vp, and the voltage of the voltage supply line Vp may be set to the voltage $V_{read}/2$. Further, a voltage 0V may be transferred to unselected word lines WL1, WL2, WL4, and WL5. For example, the unselected word lines WL1, WL2, WL4, and WL5 may be brought into conduction with the voltage supply line VUX, and the voltage of the voltage supply line VUX may be set to the voltage 0V.

As illustrated in FIG. 11, a read pulse having an amplitude $V_{read}$ and a pulse width $t_{read}$ may be supplied to the selected memory cell MC. When the selected memory cell MC33 is in the set state (low resistance state: crystalline state), a current may flow in the selected memory cell MC33. Meanwhile, when the selected memory cell MC33 is in the reset state (high resistance state: amorphous state), a current may hardly flow in the selected memory cell MC33.

In addition, in the read operation, for example, data may be read bit by bit from the plurality of selected memory mats MM. That is, the sense amplifier circuit in the column control circuit 16 may detect the magnitude relationship between the voltage or current of the selected bit line BL3 and a predetermined threshold voltage, and output the magnitude relationship as data of "0" or "1" to the data buffer circuit. Further, the data in the data buffer circuit may be output to the controller 20 through the input/output control circuit 17. The controller 20 may perform error detection/correction or the like on the received data and outputs the result of the error detection/correction or the like to a host computer or the like.

Further, in the read operation, the voltage $V_{read}/2$ may be supplied to unselected memory cells MC13, MC23, MC43, MC53, MC31, MC32, MC34, and MC35 (hereinafter, referred to as "semi-selected memory cells" or the like) connected to the selected bit line BL3 or the selected word line WL3. However, since the voltage $V_{read}/2$ is set to be smaller than the voltage $V_1$ in FIG. 10, a current may hardly flow in the semi-selected memory cells MC13, MC23, MC43, MC53, MC31, MC32, MC34, and MC35.

[Set Operation]

Figure 13:
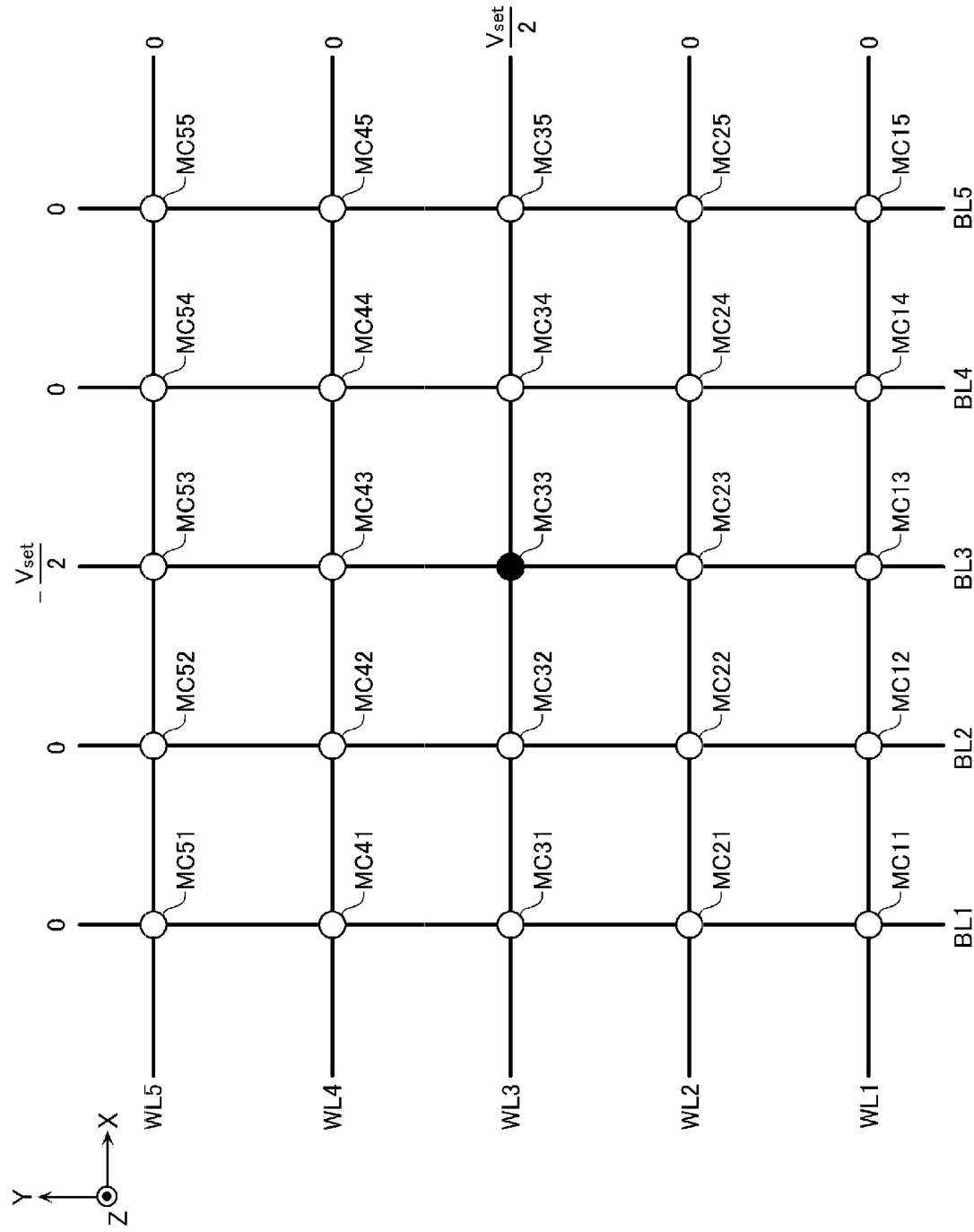
FIG. 13 is a schematic view illustrating voltages supplied to a bit line BL and a word line WL in a set operation.

FIG. 13 is a schematic view illustrating voltages supplied to bit lines BL and word lines WL in a set operation.

In the set operation, for example, a plurality of memory mats MM arranged in the X direction are selected from the plurality of memory mats MM formed on the substrate 100 (see FIG. 5), and the following operation is executed in the plurality of selected memory mats MM. That is, a voltage $-V_{set}/2$ may be transferred to a selected bit line BL3 corresponding to the bit of "0" (or bit of "1") in the data buffer circuit, and a voltage 0V may be transferred to the other selected bit line BL3. Further, a voltage 0V may be transferred to unselected bit lines BL1, BL2, BL4, and BL5. Further, a voltage $V_{set}/2$ may be transferred to a selected word line WL3. Further, a voltage 0V may be transferred to unselected word lines WL1, WL2, WL4, and WL5.

As illustrated in FIG. 11, a set pulse (write pulse) having an amplitude $V_{set}$ and a pulse width $t_{set}$ may be supplied to the selected memory cell MC. The amplitude $V_{set}$ may be larger than the amplitude $V_{read}$. Further, the pulse width $t_{set}$ may be larger than the pulse width $t_{read}$. As a result, a current can flow in the memory cell MC to generate Joule heat, and the chalcogen layer 307 or the chalcogen layer 407 can be heated. Accordingly, when the selected memory cell MC33 is in the reset state, the amorphous portion in the chalcogen layer 307 or the chalcogen layer 407 in the selected memory cell MC33 can be crystallized, and the selected memory cell MC33 can become the set state.

In the example of FIG. 11, the voltage transferred to the selected word line WL3 and the selected bit line BL3 may be maintained at the above voltage ($-V_{set}/2$ or $V_{set}/2$) for a predetermined time. Thereafter, the voltage may become 0V for a predetermined drop time $t_{set}D$.

In addition, in the set operation, a voltage $V_{set}/2$ may be supplied to the semi-selected memory cells MC13, MC23, MC43, MC53, MC31, MC32, MC34, and MC35. However, since the voltage $V_{set}/2$ is set to be smaller than the voltage $V_1$ in FIG. 10, a current may hardly flow in the semi-selected memory cells MC13, MC23, MC43, MC53, MC31, MC32, MC34, and MC35.

[Reset Operation]

Figure 14:
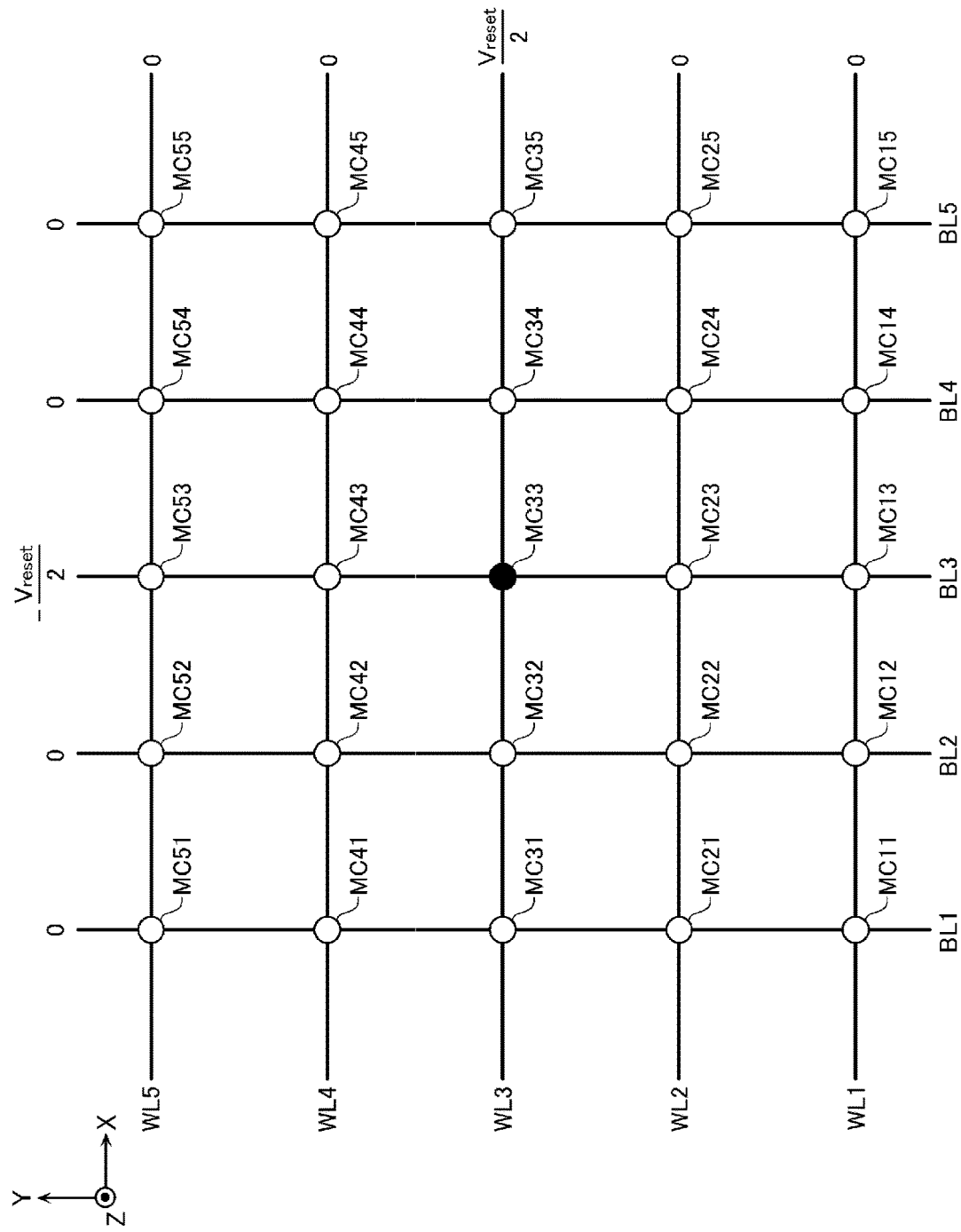
FIG. 14 is a schematic view illustrating voltages supplied to a bit line BL and a word line WL in a reset operation.

FIG. 14 is a schematic view illustrating voltages supplied to bit lines BL and word lines WL in the reset operation.

In the reset operation, for example, a plurality of memory mats MM arranged in the X direction are selected from the plurality of memory mats MM formed on the substrate 100 (see FIG. 5), and the following operation is executed in the plurality of selected memory mats MM. That is, a voltage $-V_{reset}/2$ may be transferred to a selected bit line BL3 corresponding to the bit of "0" (or bit of "1") in the data buffer circuit, and a voltage 0V may be transferred to the other selected bit line BL3. Further, a voltage 0V may be transferred to unselected bit lines BL1, BL2, BL4, and BL5. Further, a voltage $V_{reset}/2$ may be transferred to a selected word line WL3. Further, a voltage 0V may be transferred to unselected word lines WL1, WL2, WL4, and WL5.

As illustrated in FIG. 11, a reset pulse (write pulse) having an amplitude $V_{reset}$ and a pulse width $t_{reset}$ may be supplied to the selected memory cell MC. The amplitude $V_{reset}$ may be larger than the amplitude $V_{set}$. Further, the pulse width $t_{reset}$ may be smaller than the pulse width $t_{set}$. As a result, a current can flow in the memory cell MC to generate Joule heat, and the chalcogen layer 307 or the chalcogen layer 407 can become a molten state. Accordingly, in this state, when the voltages of the selected bit line BL and the selected word line WL are suddenly lowered, the supply of Joule heat can be stopped so that the chalcogen layer 307 or the chalcogen layer 407 can be rapidly cooled, and the melted portion of the chalcogen layer 307 or the chalcogen layer 407 can be solidified into the amorphous state so that the selected memory cell MC33 can become the reset state.

In the example of FIG. 11, the voltage transferred to the selected word line WL3 and the selected bit line BL3 may be maintained at the above voltage ($-V_{reset}/2$ or $V_{reset}/2$) for a predetermined time. Thereafter, the voltage may become 0V for a predetermined drop time $t_{reset}D$. In the example of FIG. 11, the drop time $t_{reset}D$ of the reset pulse may be smaller than rese the drop time $t_{set}D$ of the set pulse. Further, a speed $|V_{reset}/t_{reset}D|$ at which the voltage id dropped in the reset operation may be higher than a speed $|V_{set}/t_{set}D|$ at which the voltage is dropped in the set operation.

Further, in the reset operation, a voltage $V_{reset}/2$ may be supplied to the semi-selected memory cells MC13, MC23, MC43, MC53, MC31, MC32, MC34, and MC35. However, since the voltage $V_{reset}/2$ is set to be smaller than the voltage V1 in FIG. 10, a current may flow in the semi-selected memory cells MC13, MC23, MC43, MC53, MC31, MC32, MC34, and MC35.

[Change in Characteristics of Nonlinear Element NO]

As described above, in the semiconductor memory device according to the present embodiment, the chalcogen layers 304 and 404 may be employed as the nonlinear element NO. Here, while the chalcogen layers 304 and 404 have characteristics suitable as the nonlinear element NO, when the state transition between the high resistance state and the low resistance state is repeated a predetermined number of times or more, the characteristics may change. For example, when the cell voltage Vcell is equal to or lower than the voltage $V_1$ in FIG. 10, the cell current Icell (hereinafter, referred to as a "leak current") may increase. The increase in the leak current may cause the increase in bit error rate power consumption, which may shorten the life of the semiconductor memory device.

Here, the change in characteristics of the chalcogen layers 304 and 404 may be due to a change of composition distribution in the chalcogen layers 304 and 404. For example, when the chalcogen layers 304 and 404 contain germanium (Ge) and selenium (Se), positive ions such as selenium ions may move to the cathode side, and negative ions such as germanium ions may move to the anode side, due to the influence of an electric field generated during the read operation and the write operation.

[Recovery Sequence]

In the present embodiment, the change in characteristics of the chalcogen layer 304 or 404 as described above may be detected, and a current may be flown in the chalcogen layer 304 or 404 in which the change in characteristics has been detected, to melt the chalcogen layer 304 or 404. At this time, a current may be flown under a condition that the positive ions and negative ions in the chalcogen layer 304 or 404 are more affected by diffusion than by the electric field. As a result, it is possible to alleviate the bias of the positive ions and negative ions in the chalcogen layer 304 or 404, recover the characteristics of the chalcogen layers 304 and 404, and implement the long life of the semiconductor memory device. Hereinafter, this operation is referred to as a "recovery sequence."

Figure 15:
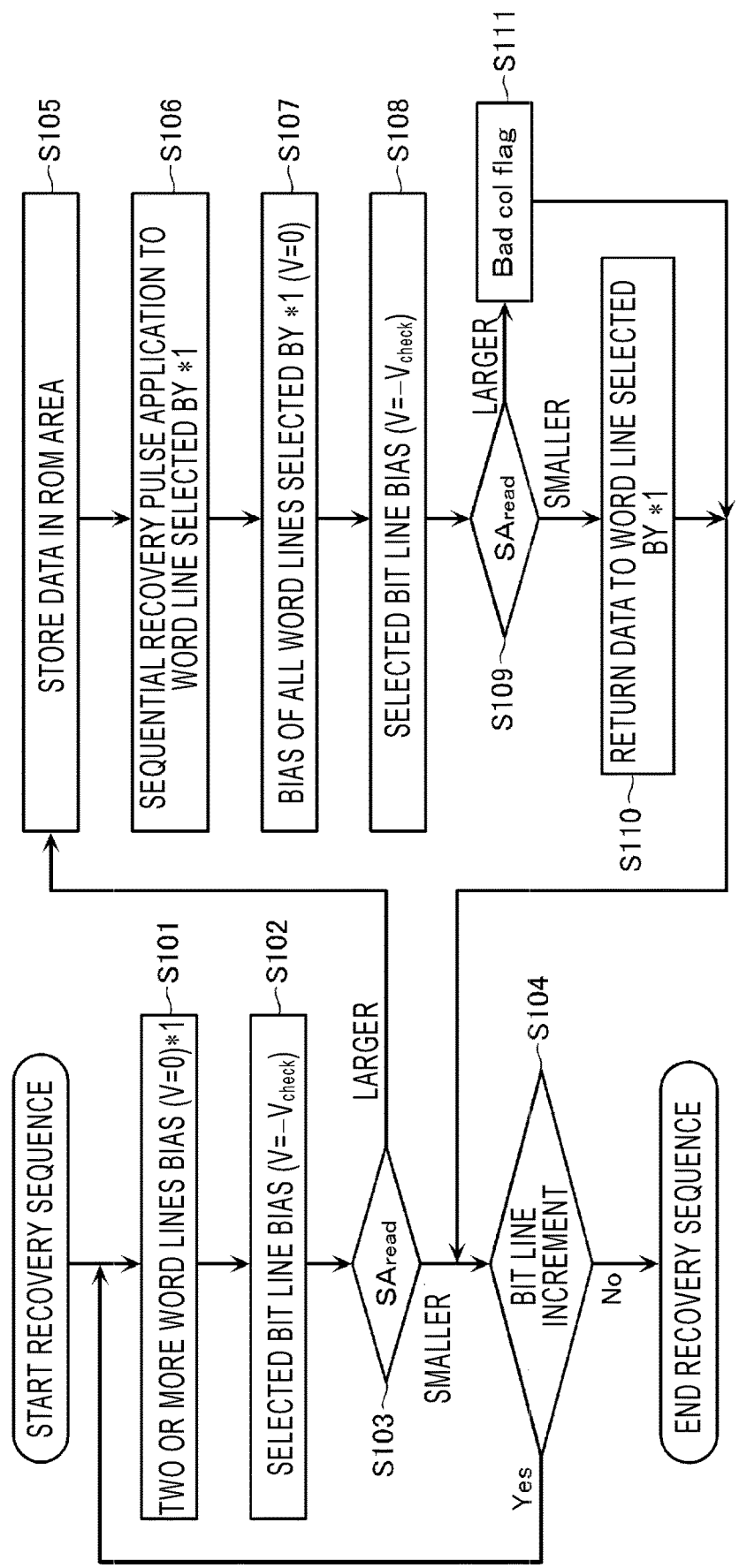
FIG. 15 is a flowchart for showing a recovery sequence according to the first embodiment.
Figure 16:
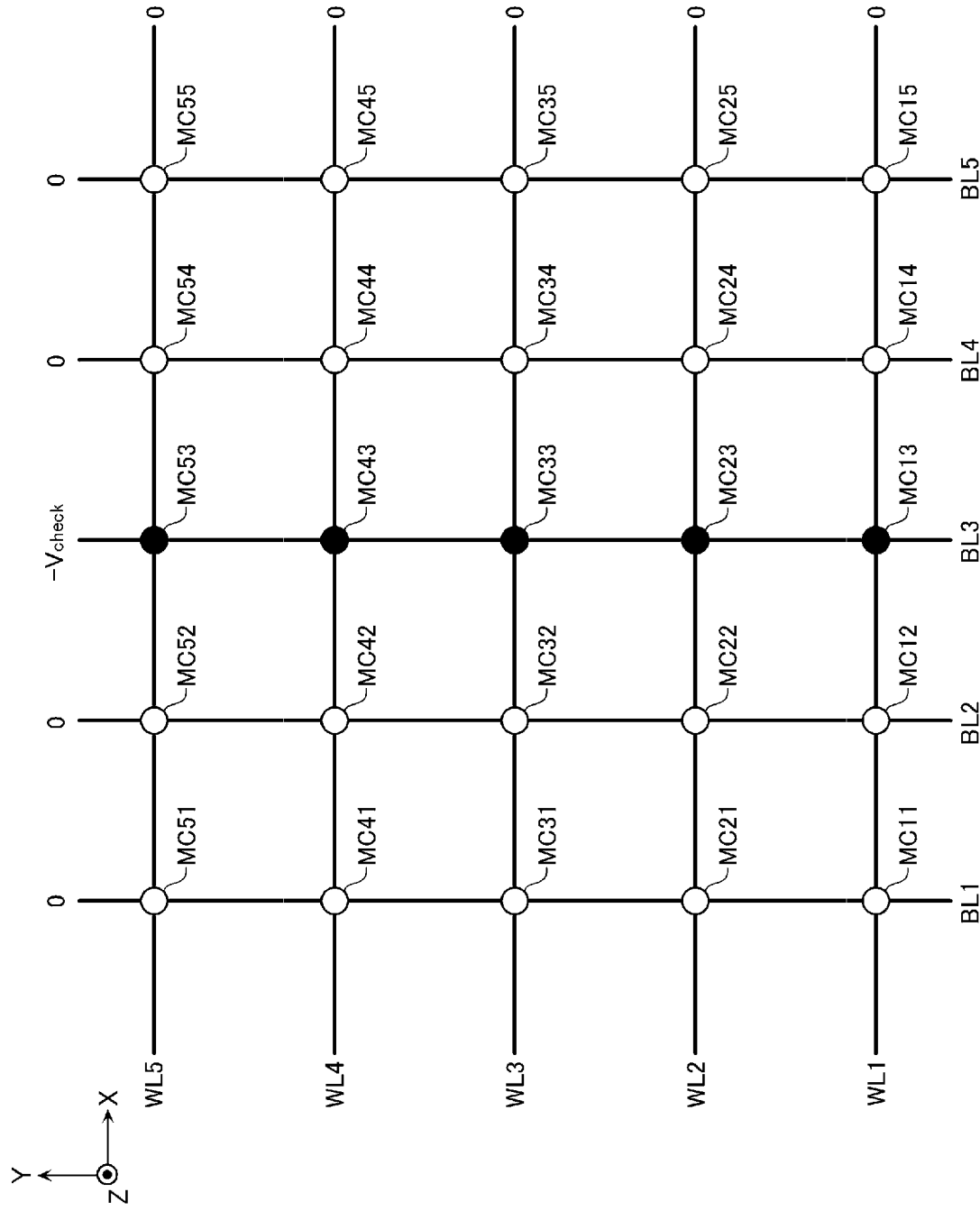
FIG. 16 is a schematic view illustrating voltages supplied to a bit line BL and a word line WL in a check pulse application operation.
Figure 17:
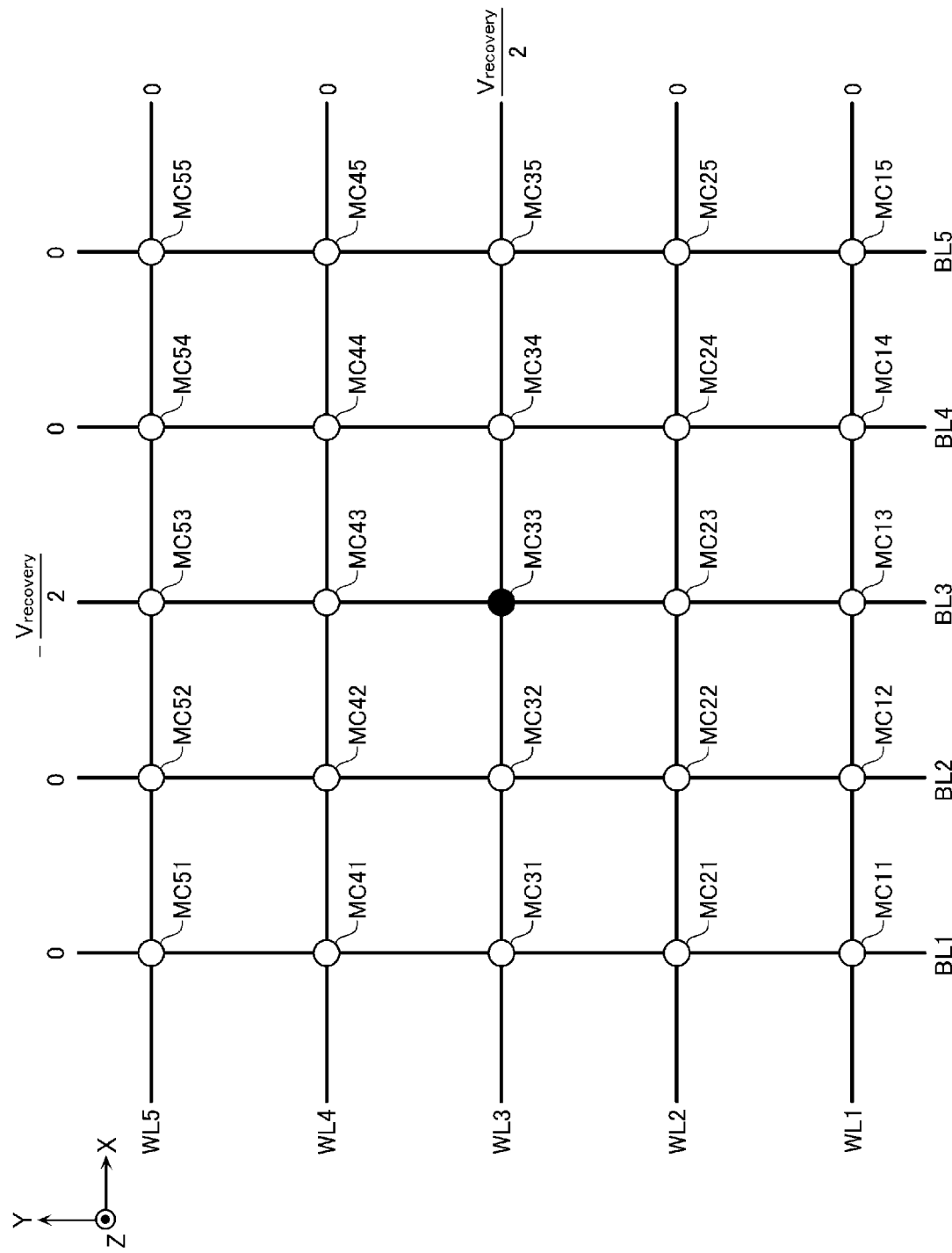
FIG. 17 is a schematic view illustrating voltages supplied to bit lines BL and word lines WL in a recovery pulse application operation.

Next, the recovery sequence of the semiconductor memory device according to the present embodiment will be described in more detail with reference to FIGS. 15 to 17. FIG. 15 is a flowchart for showing the recovery sequence according to the present embodiment. FIG. 16 is a schematic view illustrating voltages supplied to bit lines BL and word lines WL in a check pulse application operation. FIG. 17 is a schematic view illustrating voltages supplied to bit lines BL and word lines WL in a recovery pulse application operation.

In steps S101 to S103, the check pulse application operation may be executed.

For example, in step S101 and step S102, a plurality of memory mats MM may be selected from the plurality of memory mats MM formed on the substrate 100 (see FIG. 5), and the following operation may be executed in the plurality of selected memory mats MM. That is, for example, as illustrated in FIG. 16, a voltage $-V_{check}$ may be transferred to a selected bit line BL3. Further, a voltage 0V may be transferred to unselected bit lines BL1, BL2, BL4, and BL5. Further, a voltage 0V may be transferred to two or more word lines WL. In the example of FIG. 16, the voltage 0V may be transferred to all the word lines WL1 to WL5 in the memory mats MM.

A check pulse having an amplitude $V_{check}$ and a pulse width $t_{read}$ may be supplied to a selected memory cell MC. The voltage $V_{check}$ may have a magnitude of, for example, about the voltage $V_{read}/2$. In the example of FIG. 10, the voltage $V_{check}$ may be set to be smaller than the voltage $V_1$. As a result, a leak current may flow in the selected bit line BL3 through a plurality of memory cells MC13 to MC53 (a memory cell group) connected to the selected bit line BL3.

In step S103, the leak current that has flowed through the memory cell group may be compared with a reference value. For example, when at least one memory cell group having a large leak current is detected, the control circuit 18 may execute the recovery pulse application operation. In addition, for example, when the number of memory cell groups having a large leak current is equal to or larger than a predetermined number, the control circuit 18 may execute the recovery pulse application operation. When the recovery pulse application operation is executed, the process may proceed to step S105. When the recovery pulse application operation is not executed, the process may proceed to step S104.

In step S104, it may be determined whether or not the check pulse application operation (the process of steps S101 to S103) has been performed for all the bit lines BL to be checked. When it is determined that the check pulse application operation has not been performed, for example, another bit line BL may be selected as a selected bit line BL (e.g., by increasing the address of the bit line BL by 1), and then, the process may proceed to step S101. When it is determined that the check pulse application operation has been performed, the recovery sequence may be ended.

In step S105, data stored in the plurality of memory cells to be checked in the check pulse application operation may be sequentially read out, and may be written in other areas such as a ROM area of the memory cell array MCA. For example, as described with reference to FIG. 16, when the voltage 0V is supplied to all the word lines WL1 to WL5 in the memory mat MM in step S101, five read operations may be sequentially executed corresponding to all the memory cells MC13 to MC53 connected to the selected bit line BL3 in step S102, and data corresponding to the five read operations may be written in the ROM area or the like.

In step S106, the recovery pulse supply operation may be executed plural times.

Figure 18:
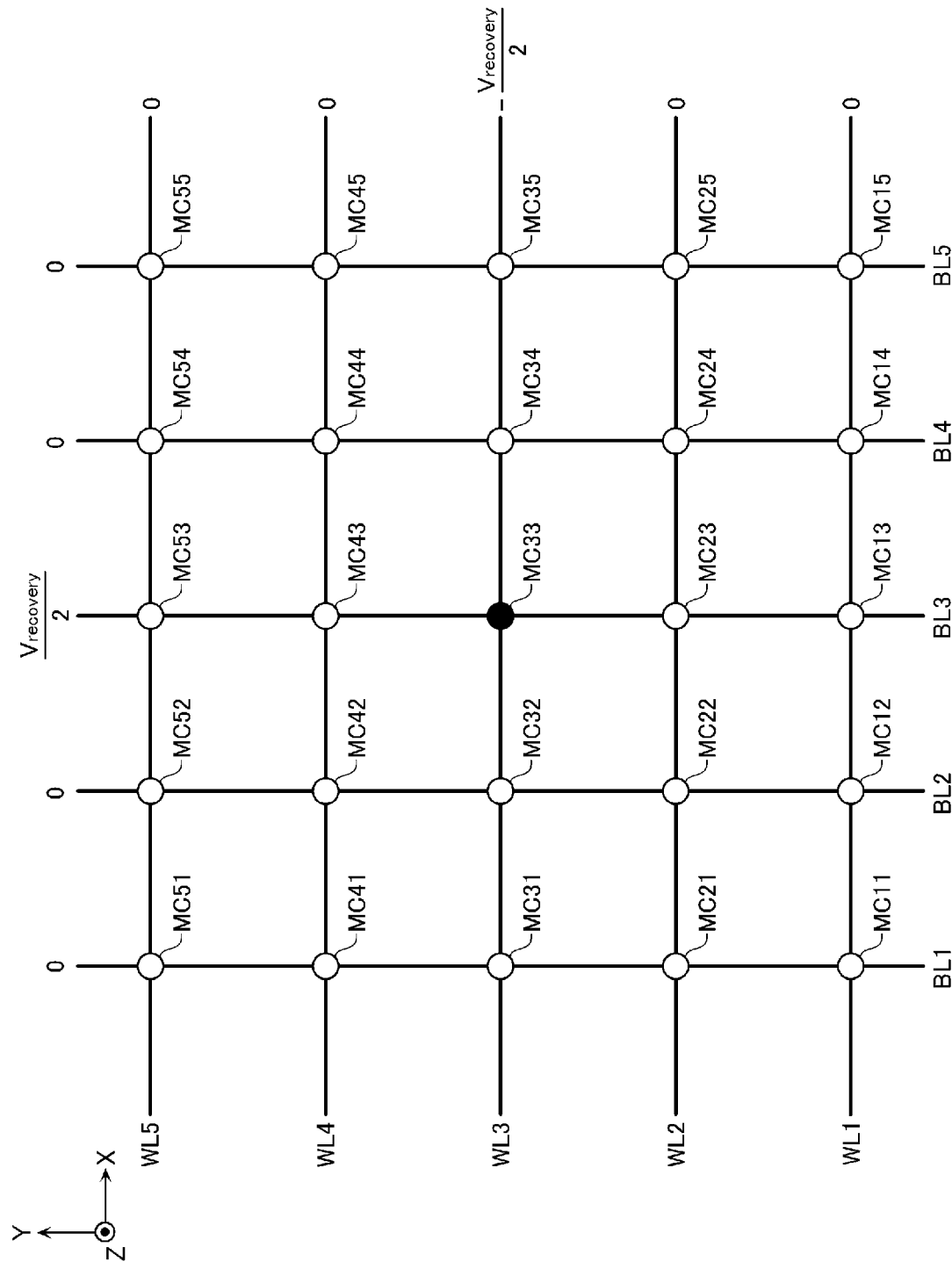
FIG. 18 is a schematic view illustrating voltages supplied to bit lines BL and word lines WL in a recovery pulse supply operation according to a second embodiment.

In the recovery pulse supply operation, for example, a plurality of memory mats MM to be checked in the check pulse application operation may be selected from the plurality of memory mats MM formed on the substrate 100 (see FIG. 5), and the following operation may be executed in the plurality of selected memory mats MM. That is, for example, as illustrated in FIG. 18, a voltage $-V_{recovery}/2$ may be transferred to a selected bit line BL3 corresponding to the bit of "0" (or bit of "1") in the data buffer circuit, and a voltage 0V may be transferred to the other selected bit line BL3. The selected bit line BL3 corresponding to the bit of "0" (or bit of "1") in the data buffer circuit may correspond to a bit in which the leak current is detected in step S103. Further, a voltage 0V may be transferred to unselected bit lines BL1, BL2, BL4, and BL5. Further, a voltage $V_{recovery}/2$ may be transferred to a selected word line WL3. Further, a voltage 0V may be transferred to unselected word lines WL1, WL2, WL4, and WL5.

As illustrated in FIG. 11, a recovery pulse having an amplitude $V_{recovery}$ and a pulse width $t_{recovery}$ may be supplied to the selected memory cell MC.

The amplitude $V_{recovery}$ of the recovery pulse may be appropriately adjusted. For example, in the recovery pulse application operation, a current may be flown in the memory cell MC by supplying the recovery pulse, and the chalcogen layers 304 and 404 may be melted by Joule heat generated by the current. To this end, for example, the amplitude $V_{recovery}$ of the recovery pulse may be set to be larger than the larger one of the amplitude $V_{set}$ of the set pulse and the amplitude $V_{reset}$ of the reset pulse. In addition, the amplitude $V_{recovery}$ of the recovery pulse may be set to be equal to relatively larger one of the amplitude $V_{set}$ of the set pulse and the amplitude $V_{reset}$ of the reset pulse. Further, the pulse width $t_{recovery}$ of the recovery pulse may be set to be larger than the pulse width $t_{reses}$ of the reset pulse. In the illustrated example, the amplitude $V_{recovery}$ may be equal to the amplitude $V_{reset}$.

Further, the pulse width $t_{recovery}$ of the recovery pulse may be appropriately adjusted. For example, in the recovery pulse supply operation, it is desirable to sufficiently diffuse the positive ions and negative ions in the molten chalcogen layer 304 or 404. To this end, for example, the pulse width $t_{recovery}$ of the recovery pulse may be set to be larger than the pulse width $t_{reset}$ of the reset pulse. However, when the amplitude $V_{recovery}$ of the recovery pulse is sufficiently large, since the temperature of the chalcogen layer 304 or 404 becomes sufficiently high, even when the pulse width $t_{recovery}$ of the recovery pulse is shorter than the pulse width $t_{reset}$ of the reset pulse, the ions in the chalcogen layer 304 or 404 may be sufficiently diffused. In the illustrated example, the pulse width $t_{recover}$ of the recovery pulse may be larger than the pulse width $t_{reset}$ of the reset pulse and the pulse width $t_{set}$ of the set pulse.

Further, the drop time of the recovery pulse may be appropriately adjusted. For example, in the example of FIG. 11 where the pulse width of the recovery pulse is $t_{recovery}$, the drop time $t_{recovery}D$ of the recovery pulse is set to be relatively short, and a voltage drop speed $|V_{recovery}/t_{recovery}D|$ is approximately equal to that of the reset pulse. Meanwhile, in the example of FIG. 11 where the pulse width of the recovery pulse is $t_{recovery}'$ ($>t_{recovery}$), the drop time $t_{recovery}D'$ of the recovery pulse is set relatively long, and a voltage drop speed $|V_{recovery}'/t_{recovery}D'|$ is lower than the speed $|V_{set}/t_{set}D|$ in the set pulse and the speed $|V_{reset}/t_{reset}D|$ in the reset pulse. In this way, by reducing the voltage drop speed, the positive ions and negative ions in the chalcogen layer 304 or 404 can be gradually solidified, so that an unintended disorder of atomic arrangement can be prevented, and a formation of leak site caused from the unintended disorder of atomic arrangement can be prevented.

Such a recovery pulse supply operation may be sequentially executed for a plurality of memory cells MC to be checked in the check pulse application operation. For example, as described with reference to FIG. 16, when the voltage 0V is supplied to all the word lines WL1 to WL5 in the memory mat MM in step S101, five recovery pulse supply operations are sequentially executed corresponding to all the memory cells MC13 to MC53 connected to the selected bit line BL3 in step S102.

In steps S107 to S109, the check pulse application operation may be performed again for the plurality of memory cells MC to be checked in the check pulse application operation in steps S101 to S103, to determine whether or not the characteristics of the chalcogen layer 304 or 404 have been recovered. For example, when at least one bit having a large leak current is detected, the control circuit 18 may determine that the characteristics of the chalcogen layer 304 or 404 have not been recovered. In addition, for example, when the number of bits having a large leak current is equal to or larger than a predetermined number, the control circuit 18 may determine that the characteristics of the chalcogen layer 304 or 404 have not been recovered. When it is determined that the characteristics of the chalcogen layer 304 or 404 have been recovered, the process may proceed to step S110. When it is determined that the characteristics of the chalcogen layer 304 or 404 have not been recovered, the process may proceed to step S111.

In step S110, the data written in the other area such as the ROM area or the like in step S105 may be sequentially read, and may be sequentially written in the original memory cell MC. For example, as described with reference to FIG. 16, when the voltage 0V is supplied to all the word lines WL1 to WL5 in the memory mat MM in step S101, five write operations may be sequentially executed corresponding to all the memory cells MC13 to MC53 connected to the selected bit line BL3 in step S102.

In step S111, the bit line BL to be checked in the check pulse application operation in steps S101 to S103 may be recognized as a defective column. Address information of such a defective column may be transmitted to, for example, the controller 20.

Second Embodiment

Next, a semiconductor memory device according to a second embodiment will be described. In addition, in the following description, the same components as those in the first embodiment will be denoted by the same reference numerals as used in the first embodiment, and descriptions thereof will be omitted.

FIG. 18 is a schematic view illustrating voltages supplied to bit lines BL and word lines WL in a recovery pulse supply operation according to a second embodiment.

As described with reference to FIG. 17, in the recovery pulse supply operation according to the first embodiment, the recovery pulse may have the same polarity as the read pulse (FIG. 12), the set pulse (FIG. 13), and the reset pulse (FIG. 14). Meanwhile, in the second embodiment, the polarity of the recovery pulse may be opposite to the polarity of the read pulse (FIG. 12), the set pulse (FIG. 13), and the reset pulse (FIG. 14), as illustrated in FIG. 18.

With this method, in the recovery pulse supply operation, not only diffusion but also an electric field may be used to alleviate the bias of the positive ions and negative ions in the chalcogen layer 304 or 404.

Third Embodiment

Next, a semiconductor memory device according to a third embodiment will be described. In addition, in the following description, the same components as those in the first embodiment will be denoted by the same reference numerals as used in the first embodiment, and descriptions thereof will be omitted.

Figure 19:
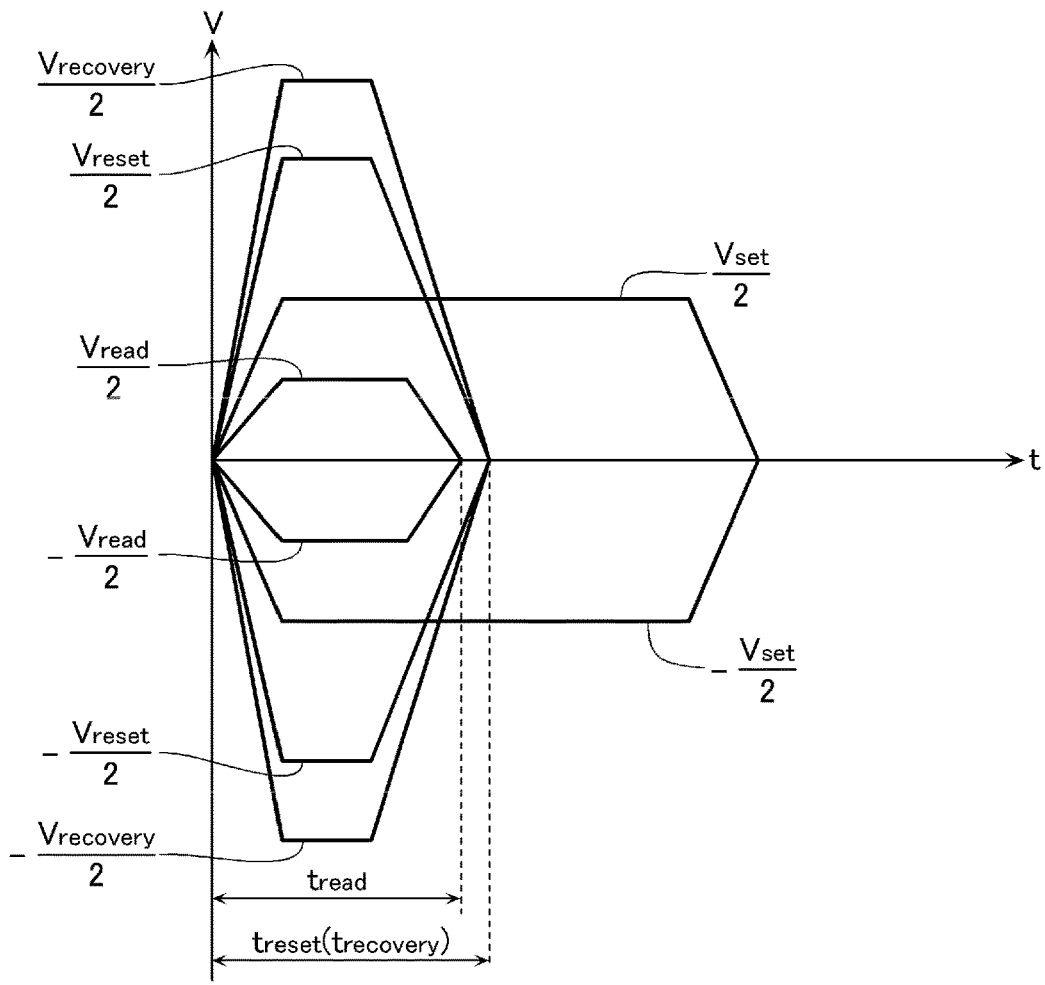
FIG. 19 is a schematic graph illustrating voltages of a selected bit line BL and a selected word line WL in a read operation, a write operation and the like according to a third embodiment.

FIG. 19 is a schematic graph illustrating voltages supplied to a selected bit line BL and a selected word line WL in a read operation, a write operation and the like according to a third embodiment. The vertical axis represents voltages of the selected bit line BL and the selected word line WL, and the horizontal axis represents time.

The amplitude $V_{recovery}$ of the recovery pulse illustrated in FIG. 11 is equal to the amplitude $V_{reset}$, and the pulse width $t_{recovery}$ is larger than the pulse width $t_{set}$. Meanwhile, the amplitude $V_{recovery}$ of the recovery pulse illustrated in FIG. 19 is larger than the amplitude $V_{set}$ and the amplitude $V_{reset}$, and the pulse width $t_{recovery}$ is equal to the pulse width $t_{reset}$.

Further, as in the first embodiment, the recovery pulse according to the present embodiment may have the same polarity as the read pulse (FIG. 12), the set pulse (FIG. 13), and the reset pulse (FIG. 14). In addition, as in the second embodiment, the polarity of the recovery pulse may be opposite to the polarity of the read pulse (FIG. 12), the set pulse (FIG. 13), and the reset pulse (FIG. 14).

OTHER EMBODIMENTS

The semiconductor memory devices according to the first to third embodiments have been described. However, the description is merely an example, and the specific configuration and others may be appropriately changed.

For example, in the first embodiment, as described with reference to FIGS. 12 to 14 and 17, in the read operation, the write operation, and the recovery pulse supply operation, a positive voltage may be supplied to the voltage supply line Vp corresponding to the selected word line WL, a negative voltage may be supplied to the voltage supply line Vn corresponding to the selected bit line BL, and 0V may be supplied to the voltage supply line VUX corresponding to the unselected word lines WL and the voltage supply line VUB corresponding to the unselected bit lines BL.

Figure 20:
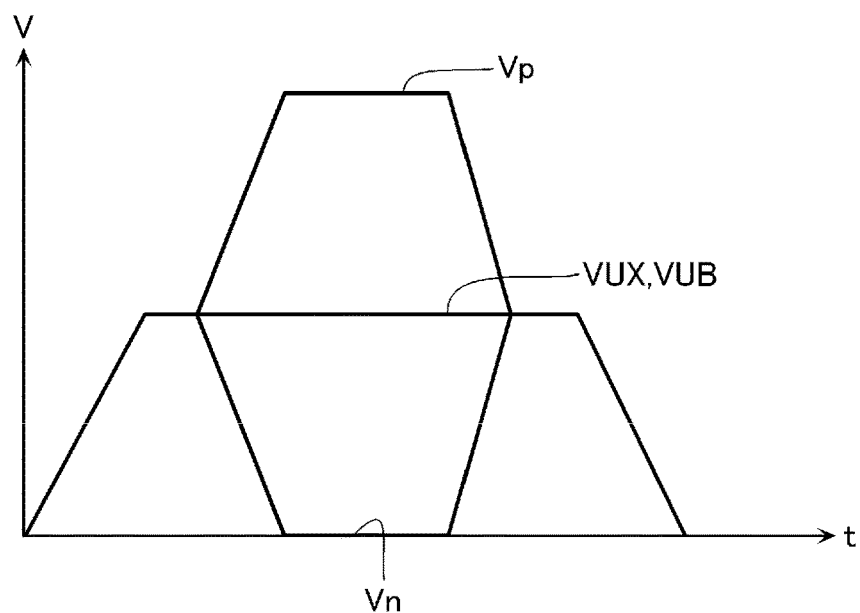
FIG. 20 is a schematic graph illustrating a method of applying a voltage according to a modification.

However, for example, as illustrated in FIG. 20, it is also possible to adopt a method that does not use a negative voltage. In this case, in the read operation, the write operation and the recovery pulse supply operation, for example, as illustrated in FIG. 20, a positive voltage may be supplied to the voltage supply line Vp corresponding to the selected word line WL, 0V may be supplied to the voltage supply line Vn corresponding to the selected bit line BL, and a voltage of about half of the voltage of the voltage supply line Vp may be supplied to the voltage supply line VUX corresponding to the unselected word lines WL and the voltage supply line VUB corresponding to the unselected bit lines BL.

Further, in the example described above, the voltage of the unselected bit lines BL and the voltage of the unselected word lines WL may be set to be equal to each other. Accordingly, for example, when a voltage supplied to the selected memory cell MC is V, a voltage V/2 may be supplied to the semi-selected memory cell MC, and the voltage 0V may be supplied to the other unselected memory cells MC.

Figure 21:
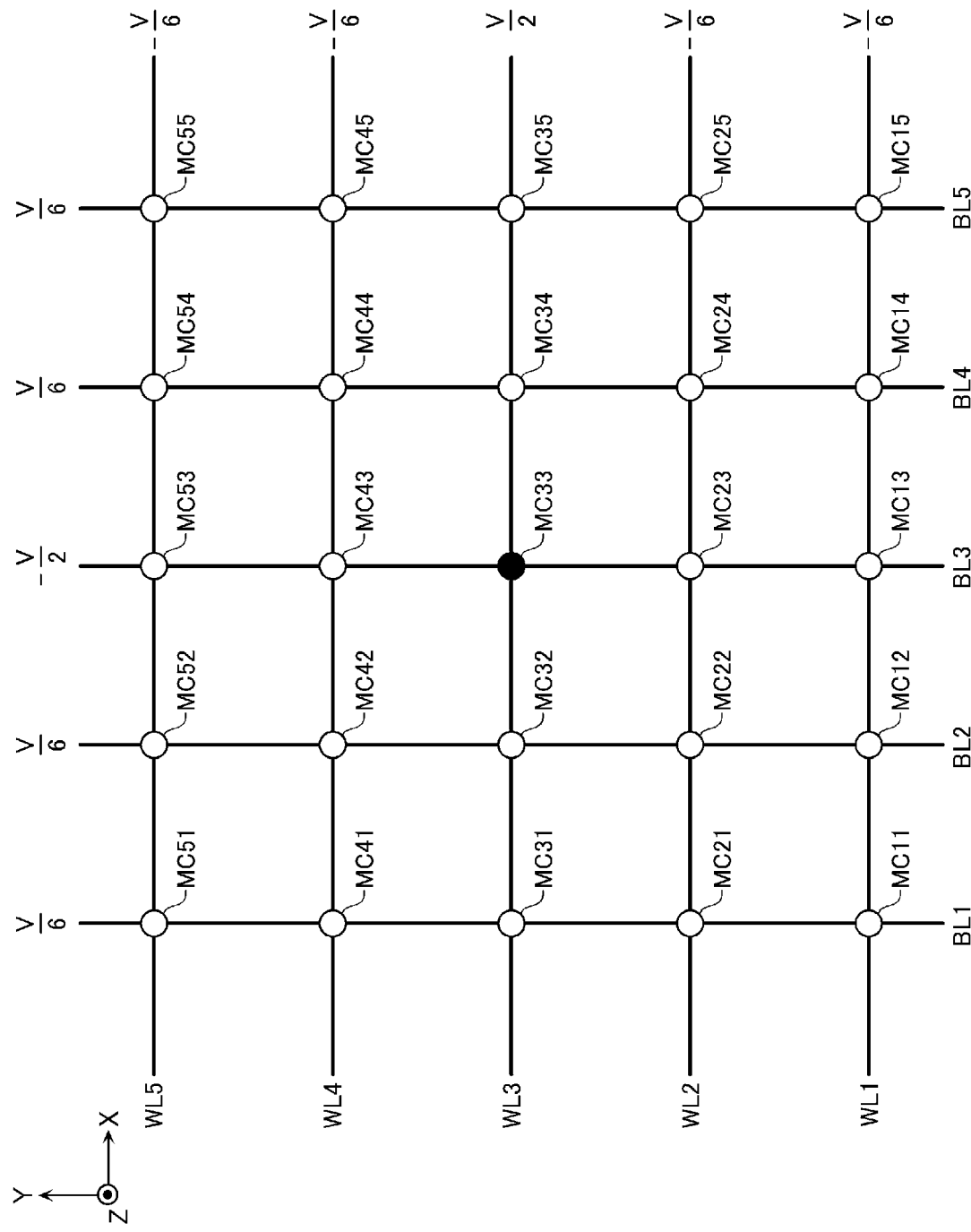
FIG. 21 is a schematic graph illustrating a method of applying a voltage according to a modification.

However, the voltage of the unselected bit lines BL and the voltage of the unselected word lines WL may be set to be different from each other. For example, as illustrated in FIG. 21, when a difference between the voltage of the selected word line WL3 and the voltage of the selected bit line BL3 is V, the voltage of the unselected word lines WL1, WL2, WL4, and WL5 may be set to be larger by V/3 than the voltage of the selected bit line BL3, and the voltage of the unselected bit lines BL1, BL2, BL4, and BL5 may be set to be smaller by V/3 than the voltage of the selected word line WL3. With this method, a voltage V/3 may be supplied to the semi-selected memory cell MC and the other unselected memory cells MC. Accordingly, it is possible to reduce a voltage supplied to the semi-selected memory cell MC as compared with the example described above.

Figure 22:
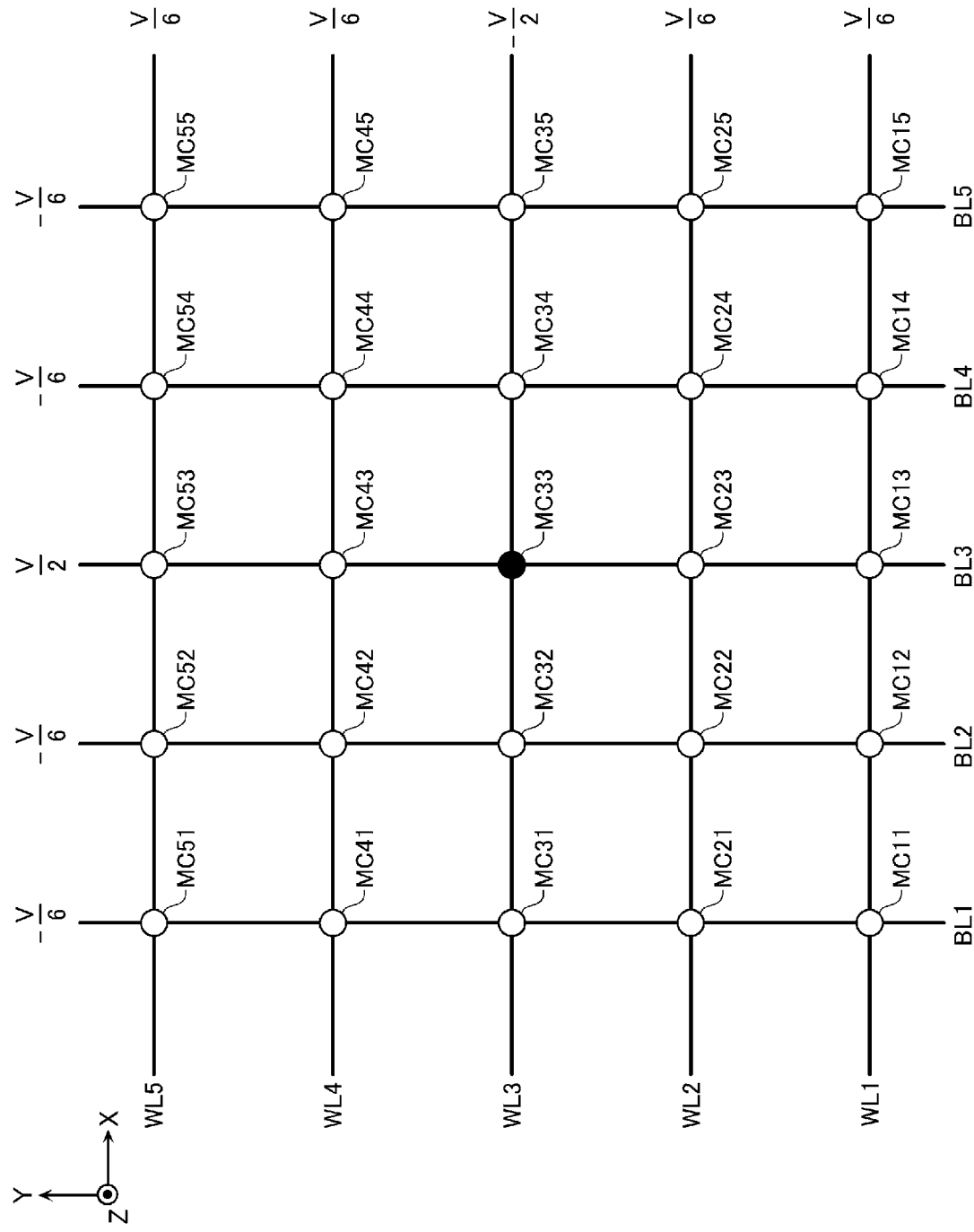
FIG. 22 is a schematic graph illustrating a method of applying a voltage according to a modification.

Further, when the method described above is employed, a positive voltage and a negative voltage may be applied to the bit lines BL and the word lines WL. Accordingly, for example, as illustrated in FIG. 22, the polarity of the recovery pulse may be made opposite to the polarity of the read pulse, the set pulse and the reset pulse, as in the second embodiment.

Further, the conditions, timings and so on for executing the above-described recovery sequence may be appropriately adjusted. For example, the above-described recovery sequence may be executed when a predetermined or higher error bit rate is detected by the controller chip 33 (FIG. 4) or the like. Further, the above-described recovery sequence may be executed according to the elapse of a predetermined or longer time (e.g., several days, several months, etc.). Further, a timing at which the above-described recovery sequence is executed for the memory chip 32 may be, for example, a timing at which a read operation, a write operation or the like is not executed for the memory chip 32 (idling).

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising:
a control circuit;
a plurality of first wirings;
a plurality of second wirings intersecting the plurality of first wirings; and
a plurality of memory cells formed between the plurality of first wirings and the plurality of second wirings,
wherein the control circuit is configured to:
supply, in a set operation, a set pulse between one of the plurality of first wirings and one of the plurality of second wirings,
supply, in a reset operation, a reset pulse between one of the plurality of first wirings and one of the plurality of second wirings, and
supply, in a first operation, a first pulse between one of the plurality of first wirings and one of the plurality of second wirings, and
wherein the first pulse has (1) an amplitude larger than a larger one of an amplitude of the set pulse or an amplitude of the reset pulse, or (2) the same amplitude as the larger amplitude, and
the first pulse has a pulse width larger than a pulse width of the reset pulse.

2. The semiconductor memory device according to claim 1, wherein each of the memory cells includes a variable resistance layer and a nonlinear element layer including chalcogen.

3. The semiconductor memory device according to claim 1, wherein the control circuit is configured to:
supply, in a read operation, a read pulse between one of the plurality of first wirings and one of the plurality of second wirings, and
supply, in a second operation executed before execution of the first operation, a second pulse between at least one of the plurality of first wirings and at least two of the plurality of second wirings.

4. The semiconductor memory device according to claim 3, further comprising:
a sense amplifier circuit connected to the plurality of first wirings,
wherein in execution of the read operation and the second operation, the sense amplifier circuit is configured to execute detection.

5. The semiconductor memory device according to claim 3, wherein the control circuit is configured to execute a first sequence, the first sequence including:
the second operation,
the read operation of two or more times executed after the second operation,
the first operation executed after the two or more times executions of the read operation, and
a write operation of two or more times executed after the first operation is executed.

6. The semiconductor memory device according to claim 5, wherein each of the read operation and the write operation is executed n times wherein n is a natural number of more than or equal to 2.

7. A semiconductor memory device comprising:
a control circuit;
a plurality of first wirings;
a plurality of second wirings intersecting the plurality of first wirings;
a plurality of memory cells formed between the plurality of first wirings and the plurality of second wirings; and
a sense amplifier circuit connected to the plurality of first wirings,
wherein the control circuit is configured to execute a first sequence, the first sequence including:
a first operation in which the control circuit is configured to supply a first pulse between at least one of the plurality of first wirings and at least two of the plurality of second wirings, and cause the sense amplifier to execute detection;
a read operation of two or more times executed after the first operation, in which the control circuit is configured to supply a read pulse is between one of the plurality of first wirings and one of the plurality of second wirings, and cause the sense amplifier circuit to execute detection;
a reset operation of two or more times executed after the two or more times executions of the read operation, in which the control circuit is configured to supply a reset pulse between one of the plurality of first wirings and one of the plurality of second wirings; and
a write operation of two or more times executed after the two or more times executions of the reset operation, in which the control circuit is configured to supply a write pulse between one of the plurality of first wirings and one of the plurality of second wirings.

8. The semiconductor memory device according to claim 7, wherein each of the memory cells includes a variable resistance layer and a nonlinear element layer including chalcogen.

9. The semiconductor memory device according to claim 7, wherein each of the read operation, the reset operation and the write operation is executed n times wherein n is a natural number of more than or equal to 2.

10. The semiconductor memory device according to claim 7, wherein the control circuit is configured to supply, in a further operation, a further pulse between one of the plurality of first wirings and one of the plurality of second wirings, and
wherein the further pulse has (1) an amplitude larger than a larger one of an amplitude of the first pulse or an amplitude of the reset pulse, or (2) the same amplitude as the larger amplitude, and
the further pulse has a pulse width larger than a pulse width of the reset pulse.

11. The semiconductor memory device according to claim 10, wherein the control circuit is configured to:
execute the further operation after the two or more times executions of the read operation, and
execute the two or more times executions of the write operation after the further operation is executed.

* * * * *